(12) United States Patent
Fujioka

(10) Patent No.: US 7,778,099 B2
(45) Date of Patent: Aug. 17, 2010

(54) SEMICONDUCTOR MEMORY, MEMORY SYSTEM, AND MEMORY ACCESS CONTROL METHOD

(75) Inventor: Shinya Fujioka, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 108 days.

(21) Appl. No.: 12/258,970

(22) Filed: Oct. 27, 2008

(65) Prior Publication Data

US 2009/0161468 A1    Jun. 25, 2009

(30) Foreign Application Priority Data

Dec. 19, 2007  (JP) .............................. 2007-327678

(51) Int. Cl.
*G11C 7/00* (2006.01)

(52) U.S. Cl. ............... 365/222; 365/233.1; 365/189.05; 365/230.03

(58) Field of Classification Search ................. 365/222, 365/233.1, 189.05, 230.03
See application file for complete search history.

(56) References Cited

U.S. PATENT DOCUMENTS 7,203,113 B2   4/2007  Takahashi et al.
7,301,842 B2   11/2007 Lee
7,362,643 B2 *  4/2008 Okada ........................ 365/222

FOREIGN PATENT DOCUMENTS

JP    2005-285271 A    10/2005
JP    2007-012244 A    1/2007

* cited by examiner

*Primary Examiner*—David Lam
(74) *Attorney, Agent, or Firm*—Arent Fox LLP

(57) ABSTRACT

A semiconductor memory is provided, the semiconductor memory including a memory core that includes a plurality of memory cells, a refresh generation unit that generates a refresh request for refreshing the memory cell, a core control unit that performs an access operation in response to an access request, a latency determination unit that activates a latency extension signal upon a conflict between activation of a chip enable signal and the refresh request and that deactivates the latency extension signal in response to deactivation of the chip enable signal, a latency output buffer that outputs the latency extension signal, and a data control unit that changes a latency from the access request to a transfer of data to a data terminal during the activation of the latency extension signal.

20 Claims, 32 Drawing Sheets

SEMICONDUCTOR MEMORY, MEMORY SYSTEM, AND MEMORY ACCESS CONTROL METHOD

CROSS-REFERENCE TO RELATED APPLICATIONS

This application claims the benefit of priority from Japanese Patent Application No. 2007-327678 filed on Dec. 19, 2007, the entire contents of which are incorporated herein by reference.

BACKGROUND OF THE INVENTION

1. Field of the Invention

This application relates to a semiconductor memory.

2. Description of Related Art

A pseudo-SRAM includes DRAM memory cells and SRAM interfaces and automatically performs refresh operations of the memory cells in a chip. In a pseudo-SRAM, refresh requests generated within a chip are generated asynchronously with an external access requests. Techniques related to the pseudo-SRAM are disclosed in Japanese Laid-open Patent Publication No. 2005-285271, Japanese Laid-open Patent Publication No. 2007-12244 or the like.

SUMMARY

According to one aspect of an embodiment, a semiconductor memory is provided that comprises: a memory core that includes a plurality of memory cells; a refresh generation unit that generates a refresh request for refreshing the memory cell; a core control unit that performs an access operation in response to an access request; a latency determination unit that activates a latency extension signal upon a conflict between activation of a chip enable signal and the refresh request and deactivates the latency extension signal responsive to deactivation of the chip enable signal; a latency output buffer that outputs the latency extension signal; and a data control unit that changes a latency from the access request to a transfer of data to a data terminal during the activation of the latency extension signal.

Additional advantages and novel features of the invention will be set forth in part in the description that follows, and in part will become more apparent to those skilled in the art upon examination of the following or upon learning by practice of the invention. In the following BRIEF DESCRIPTION OF THE DRAWINGS, "PSRAM" refers to a pseudo-SRAM according to various embodiments.

DESCRIPTION OF PREFERRED EMBODIMENTS

In FIGS. 1, 4, 5, 12, 16, 19, 20, 24, 27 and 30, signal lines illustrated in bold indicate that a plurality of signal lines are provided. A portion of a block to which the bold line is coupled includes a plurality of circuits. Signal lines are labeled with reference symbols representing names of signals transmitted through the signal lines. A signal having a reference symbol suffixed with a letter "Z" indicates a positive logic. A signal having a reference symbol prefixed with a symbol "/" indicates a negative logic.

A double-square symbol represents an external terminal such as a pad on a semiconductor chip or a lead of a package containing the semiconductor chip therein. Terminals and signals supplied through the terminals, respectively, are denoted by like reference symbols. A semiconductor memory is, for example, a clock synchronous type pseudo-SRAM (referred to hereinafter as a PSRAM). The PSRAM includes DRAM memory cells (dynamic memory cells) and SRAM interfaces.

Figure 1:
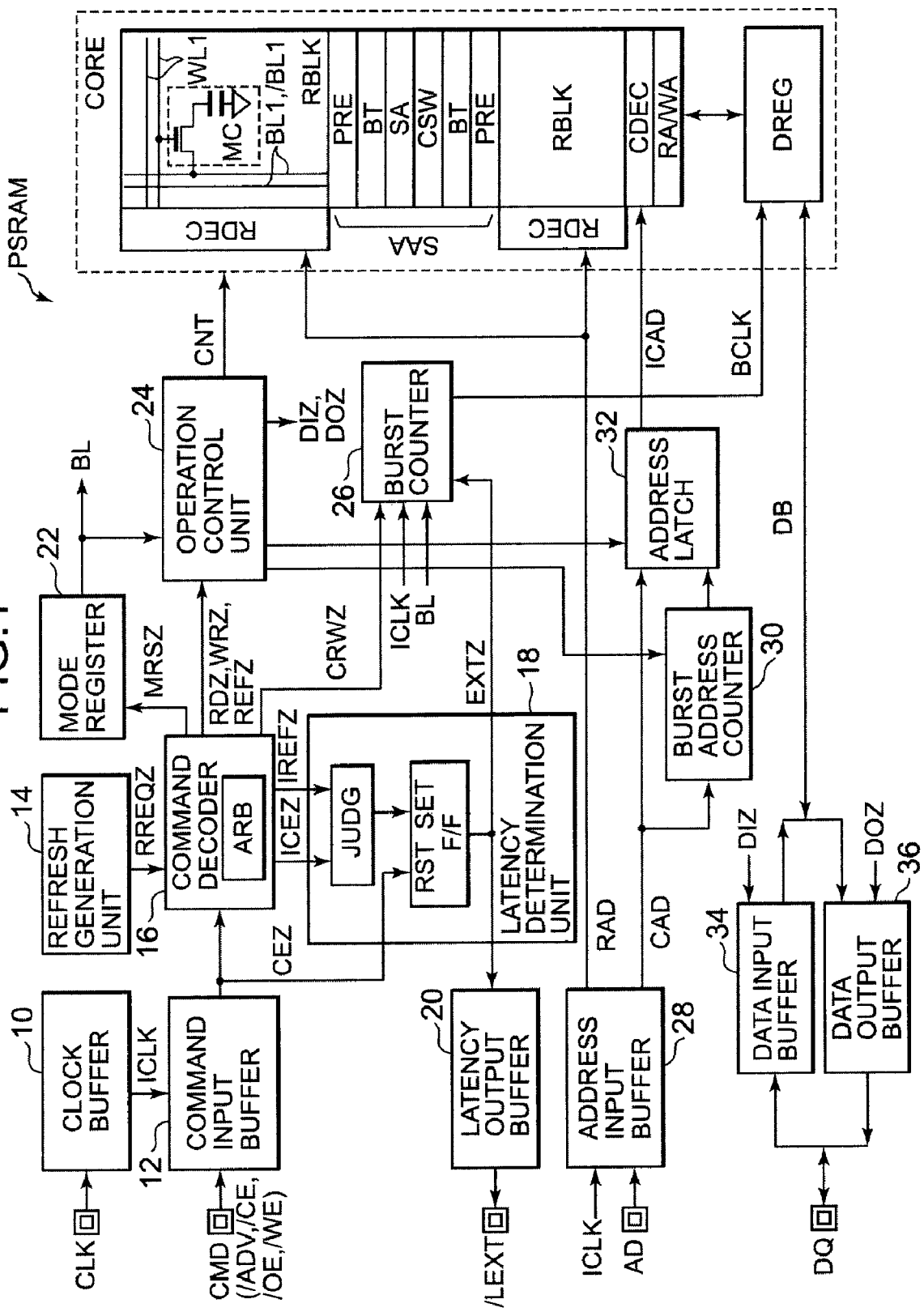
FIG. 1 shows a first embodiment.

FIG. 1 shows a first embodiment. The PSRAM in FIG. 1 includes a clock input buffer 10, a command input buffer 12, a refresh generation unit 14, a command decoder 16, a latency determination unit 18, a latency output buffer 20, a mode register 22, an operation control unit 24, a burst counter 26, an address input buffer 28, a burst address counter 30, a address latch 32, a data input buffer 34, a data output buffer 36, and a memory core CORE.

The clock input buffer 10 receives a clock signal CLK and outputs an internal clock signal ICLK. The internal clock signal ICLK is supplied to a circuit that operates in synchronization with clock. The command input buffer 12 receives a command signal CMD. The command signal CMD may be an address valid signal /ADV, a chip enable signal /CE, an output enable signal /OE, a write enable signal /WE, or the like. The CMD signal is received in synchronization with the internal clock signal ICLK and is output to the command decoder 16. The refresh generation unit 14 includes an oscillator (not shown) and periodically outputs a refresh request signal RREQZ. A cycle of generating the refresh request signal RREQZ is 10 microseconds (ms), for example.

The command decoder 16 outputs an internal chip enable signal ICEZ responsive to a chip enable signal CEZ from the command input buffer 12 and outputs an internal refresh request signal IREFZ in response to the refresh request signal RREQZ from refresh generation unit 14. The command decoder 16 activates a row read-write signal RRWZ upon an access request (a read command or a write command) being supplied thereto. The command decoder 16 activates a column read-write signal CRWZ upon receiving a read command or write command during a period in which the chip enable signal /CE is at a low level.

The command decoder 16 includes an arbiter ARB to determine priority between the chip enable signal CEZ and the refresh request signal RREQZ. The read command (a read access request) is detected based on the /OE signal at a low level during activation of the /ADV signal and the /CE signal. The write command (a write access request) is detected based on the /WE signal at a low level during the activation of the /ADV signal and the /CE signal. When the priority is given to the read command or the write command over the refresh request signal RREQZ, the command decoder 16 outputs a read signal RDZ or a write signal WRZ and outputs a refresh signal REFZ after deactivation of the /CE signal. When the priority is given to the refresh request signal RREQZ over the read command or the write command, the command decoder 16 outputs the refresh signal REFZ and outputs the read signal RDZ or the write signal WRZ in response to completion of a refresh operation. When a combination of the command signals CMD represents a mode register setting command for setting the mode register 22, the command decoder 16 outputs a mode register setting signal MRSZ.

The latency determination unit 18 includes a judgment circuit JUDG and a flip-flop F/F. When the internal refresh request signal IREFZ is being activated during activation of the internal chip enable signal ICEZ, the judgment circuit JUDG outputs a set signal for setting the flip-flop F/F. The flip-flop F/F activates an extension signal EXTZ upon the set signal being input to a set terminal SET. The flip-flop F/F deactivates the extension signal EXTZ upon a reset signal (a rising edge of the CEZ signal) being input to a reset terminal RST. The latency output buffer 20 inverts a logic level of the extension signal EXTZ to output as a latency extension signal /LEXT. A low level latency extension signal /LEXT indicates that a read latency RL or a write latency WL is increased in comparison with a standard value. A high level latency extension signal /LEXT indicates that the read latency RL or the write latency WL is equal to the standard value. The read latency RL indicates the number of clock cycles between output of a first read data signal (DQ) and supply of the read command. The write latency WL indicates the number of clock cycles between output of a first write data signal (DQ) and supply of the write command.

The mode register 22 includes a plurality of registers in which at least one of a row address signal RAD, a column address signal CAD, and a data signal DQ is set in synchronization with the mode register setting signal MRSZ. For example, the mode register 22 outputs a signal indicating a burst length BL. The burst length BL indicates the number of outputs of the data signal output from the data terminal DQ in response to a single read command and the number of inputs of the data signal received at the data terminal DQ in response to a single write command.

The operation control unit 24 outputs a control signal CNT that controls access operations (a read operation, a write operation or a refresh operation) of the memory core CORE, in response to the read signal RDZ, the write signal WRZ or the refresh signal REFZ. The control signal CNT includes a timing signal for pre-charging bit lines BL and /BL, a timing signal for activating word line WL1, a timing signal for activating a sense amplifier SA or the like. Based on the read command, data is read from a memory cell MC selected by the row address signal RAD and the column address signal CAD. Based on the write command, the data is written to the memory cell MC selected by the row address signal RAD and the column address signal CAD. Based on a refresh command, the memory cell MC coupled to the word line WL1 selected by a refresh address signal is refreshed.

The operation control unit 24 outputs timing signals, such as, a timing signal operating the burst address counter 30 and the address latch 32, a timing signal DIZ operating the data input buffer 34, and a timing signal DOZ operating the data output buffer 36. The arbiter ARB and the operation control unit 24 perform the refresh operation in response to the refresh request signal RREQZ during the deactivation of the chip enable signal /CE. The arbiter ARB and the operation control unit 24 perform the access operation (the read operation or the write operation) in response to a first access request supplied along with the activation of the chip enable signal /CE and subsequent access requests supplied during the activation of the chip enable signal /CE. The arbiter ARB and the operation control unit 24 perform the access operation after the refresh operation upon a conflict between the activation of the chip enable signal /CE and the refresh request signal RREQZ.

The burst counter 26 performs a counting operation in response to the access request (the row read-write signal RRWZ or the column read-write signal CRWZ). When a counter value reaches an expected value, the burst counter 26 outputs a burst clock signal BCLK having the number of pulses corresponding to the burst length BL in synchronization with the internal clock signal ICLK.

The expected value is a time period (a certain number of clock cycles) between the access request and the output of the pulses of the burst clock signal BCLK. The expected value is decided in response to the read/write signals RRWZ and CRWZ and the extension signal EXTZ and is increased upon activation of the latency extension signal /LEXT.

The address input buffer 28 contemporaneously receives the row address signal RAD and the column address signal CAD via different terminals within an address terminal AD so as to select the memory cell MC to be accessed. The row address signal RAD is supplied so as to select the word line WL1 and the column address signal CAD is supplied so as to select the pair of bit lines BL and /BL. In a burst read operation or in a burst write operation, the burst address counter 30 receives a column address CAD (a start address) with the address terminal AD and thereafter sequentially generates the column addresses. The number of column addresses thus generated is decided based on the burst length BL. The address latch 32 receives the column address CAD from the address terminal AD and a column address from the burst address counter 30 and outputs the column address, as an internal column address ICAD, to a column decoder CDEC.

The data input buffer 34 receives a write data signal supplied to the data terminal DQ (for example, 16 bits) during activation of the timing signal DIZ and outputs the data signal to a data bus DB. The data output buffer 36 receives read data read from the memory cell MC via the data bus DB and outputs the read data to the data terminal DQ during activation of the timing signal DOZ.

For example, the memory core CORE includes a pair of row blocks RBLK, a row decoder RDEC corresponding to each of the row blocks RBLK, a sense amplifier area SAA provided between the row blocks RBLK, the column decoder CDEC, a read amplifier RA, a write amplifier WA, and a data register DREG.

Note that the number of row blocks RBLK is four (4), eight (8), ten (10), or the like. The respective row block RBLK includes a plurality of memory cells MC arranged in a matrix manner, the word lines WL1 coupled to rows of the memory cells MC arranged in a lateral direction in FIG. 1, and the bit line BL1 (or the /BL1) coupled to columns of the memory cells MC arranged in a longitudinal direction in FIG. 1.

The sense amplifier area SAA includes a pre-charge circuit PRE and a coupling switch BT, each of which corresponds to each of the row blocks RBLK, and a sense amplifier SA and a column switch CSW, each of which is shared with the row blocks RBLK. The coupling switch BT selectively couples the pair of bit lines BL and /BL of each of the row blocks RBLK to the sense amplifier SA.

The column decoder CDEC decodes the column address signal CAD so as to select the pairs of bit lines BL and /BL, the number of which corresponds to the number of bits of the data terminal DQ. If the data register DREG has a function of converting parallel read data into serial read data, the column decoder CDEC selects the pairs of bit lines BL and /BL, the number of which corresponds to integral multiplication of the number of bits of the data terminal DQ. In an operation, the read amplifier RA amplifies complementary read data output via the column switch CSW. In a write operation, the write amplifier WA amplifies complementary write data supplied via the data bus DB and supplies the pair of bit lines BL and /BL with the data.

In the read operation, the data register DREG outputs the read data supplied via the read amplifier RA to the data bus DB in synchronization with the burst clock signal BCLK. In the write operation, the data register DREG outputs the write data supplied via the data bus DB to the write amplifier WA in synchronization with the burst clock signal BCLK. The burst counter 26 generates the burst clock signal BCLK in response to the access request and the latency extension signal /LEXT. The data register DREG transfers the read data or the write data to the data bus DB or the write amplifier WA in synchronization with the burst clock signal BCLK. The memory core CORE may be a commonly used DRAM memory core.

Figure 2:
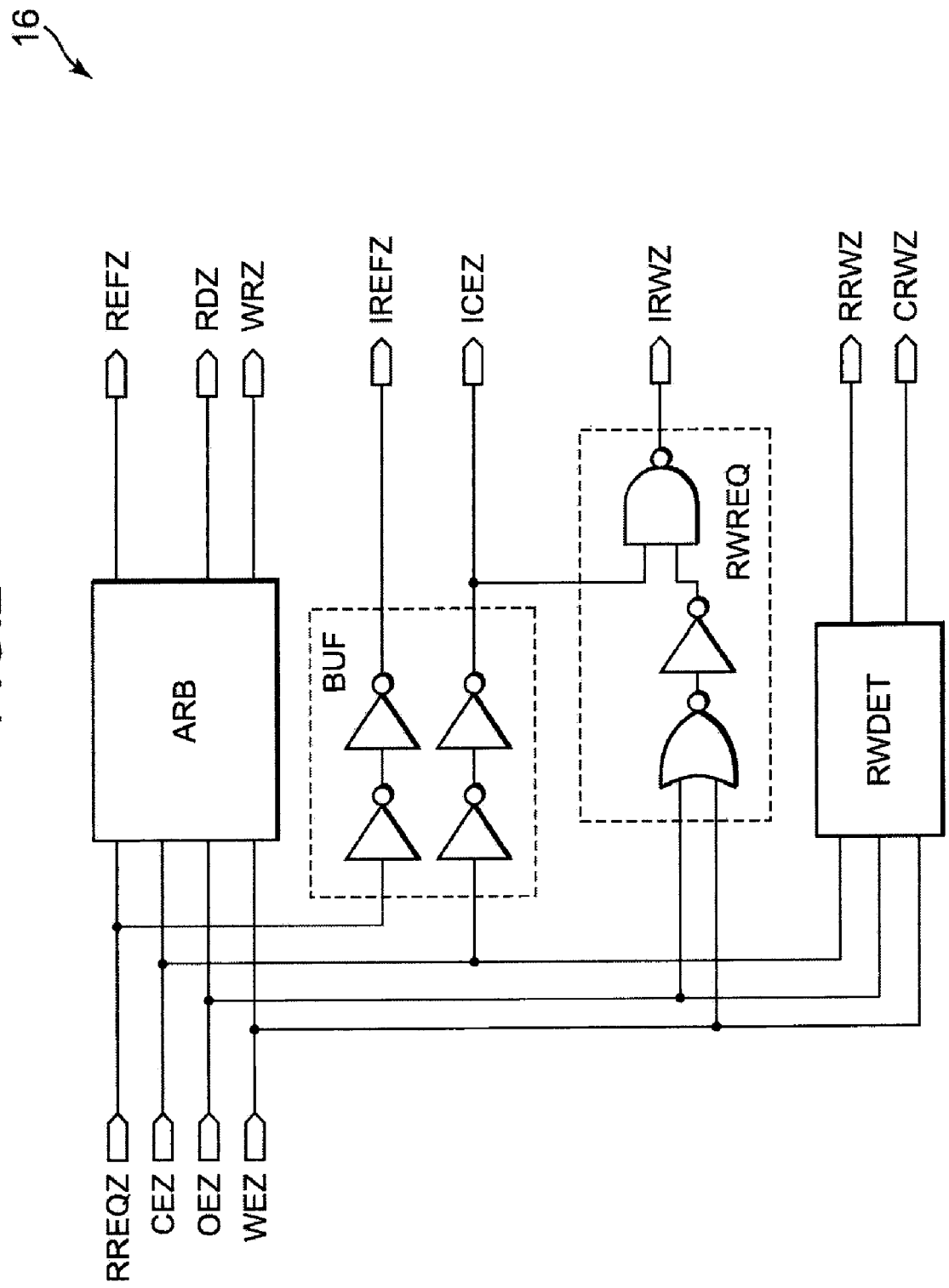
FIG. 2 shows an exemplary command decoder.

FIG. 2 shows an exemplary command decoder 16 shown in FIG. 1. The command decoder 16 includes the arbiter ARB, a buffer circuit BUF, a read-write request generation unit RWREQ, and a read-write detection unit RWDET.

The arbiter ARB activates the refresh signal REFZ when a rising edge of the refresh request RREQZ precedes the rising edge of the chip enable signal CEZ. In the above case, the arbiter ARB activates the read signal RDZ or the write signal WRZ after completion of the refresh operation in response to the refresh signal REFZ. The read signal RDZ is generated in response to an output enable signal OEZ. The write signal WRZ is generated in response to a write enable signal WEZ.

The arbiter ARB activates the read signal RDZ or the write signal WRZ when the rising edge of the chip enable signal CEZ precedes the rising edge of the refresh request RREQZ. In the above case, the arbiter ARB activates the refresh signal REFZ in response to the deactivation of the chip enable signal CEZ (/CE).

The buffer circuit BUF outputs the refresh request RREQZ as the internal refresh request signal IREFZ and outputs the chip enable signal CEZ as the internal chip enable signal ICEZ. The read-write request generation unit RWREQ activates an internal read-write signal IRWZ in response to the output enable signal OEZ or the write enable signal WEZ supplied during the activation of the chip enable signal CEZ.

The read-write detection unit RWDET activates the row read-write signal RRWZ when the output enable signal OEZ or the write enable signal WEZ are activated along with the activation of the chip enable signal CEZ. The read-write detection unit RWDET activates the column read-write signal CRWZ when the output enable signal OEZ or the write enable signal WEZ are activated during the activation of the chip enable signal CEZ. The row read-write signal RRWZ is activated when a row operation between activation of the word line WL1 and activation of the sense amplifier SA and a column operation between selection of the pair of bit lines BL and /BL and input/output of the data to/from the memory core CORE are necessary. The column read-write signal CRWZ is activated when the row operation has already been started and just the column operation is necessary.

Figure 3:
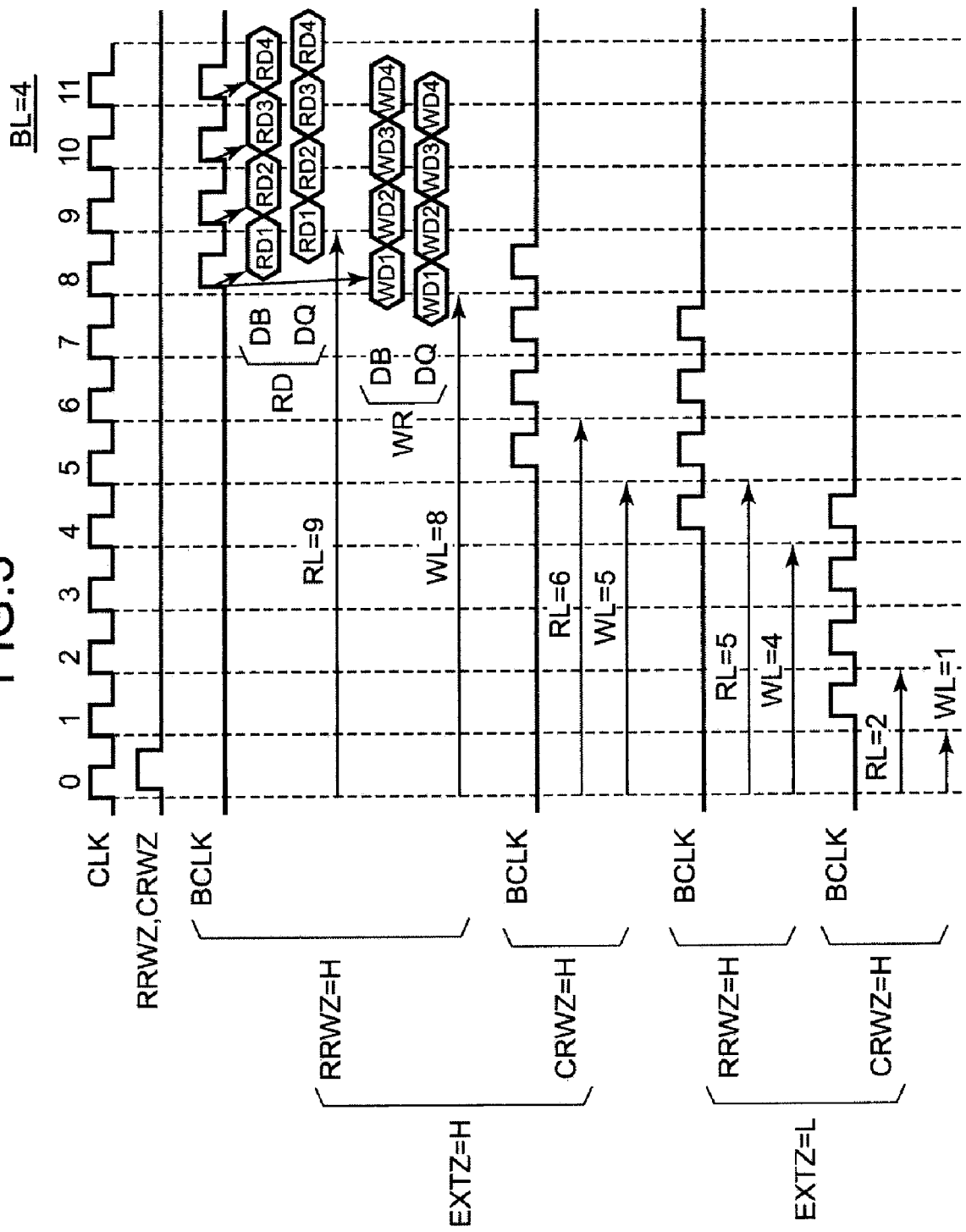
FIG. 3 shows an exemplary operation of a burst counter.

FIG. 3 shows an exemplary operation of the burst counter 26 shown in FIG. 1. The burst counter 26 has a logic circuit (not shown) operating in synchronization with the clock signal CLK. The burst counter 26 outputs the four types of burst clock signals BCLK each having different timing responsive to logic levels of the extension signal EXTZ and the row read-write signal RRWZ at a high level or the column read-write signal CRWZ at a high level. The number of pulses of the burst clock signal BCLK is equal to a value of the burst length BL (4 in this embodiment).

Upon the activation of the chip enable signal /CE, when the refresh operation is performed and the access operation accompanied by the row operation and the column operation is performed (when the EXTZ signal is at a high level and the RRWZ signal is at a high level), the burst clock signal BCLK starts being output 8 clocks behind the access command (the read command or the write command). When the counter value of the burst counter 26 reaches "8" which is the expected value, the output of the burst clock signal BCLK begins. Hereinafter, the access command (the read command or the write command) performing the access operations accompanied by the row operation and the column operation is referred to as a "row access command" (a row read command or a row write command).

When the access command is the read command, the read data RD1 to RD4 are output from the memory core CORE to the data bus DB in synchronization with the burst clock signal BCLK and is output from the data terminal DQ to an outside. A controller accessing the PSRAM (for example, PSCNT shown in FIG. 4) receives first read data RD in synchronization with a rising edge of a ninth clock signal CLK. The read latency RL is "9".

When the access command is the write command, the write data WR1 to WR4 are sequentially supplied to the data terminal DQ of the PSRAM from the controller in synchronization with rising edges of an eighth clock signal CLK through an eleventh clock signal CLK and are transferred to the data bus DB. The write latency WL is "8". The write data WD1 to WD4 on the data bus DB are written to the memory cells MC in synchronization with the burst clock signal BCLK.

When the refresh operation and the access operation accompanied only by the column operation are performed during the activation of the chip enable signal /CE (when the EXTZ signal is at the high level and the CRWZ signal is at the high level), the burst clock signal BCLK starts being output 5 clocks behind the access command. The read latency RL is "6" and the write latency WL is "5". Hereinafter, the access command performing the access operation accompanied only by the column operation (the read command or the write command) is referred to as a "column access command" (a column read command or a column write command).

The read latency RL corresponding to the column read command is less in comparison with the read latency RL corresponding to the row read command. The write latency WL corresponding to the column write command is less in comparison with the write latency WL corresponding to the row write command. The read latency RL or the write latency WL is changed depending on whether or not the row operation is accompanied, whereby the read data is output from the PSRAM with the minimum number of clock cycles or the write data is input to the PSRAM with the minimum number of clock cycles.

When the access operation accompanied by the row operation and the column operation is performed in response to the activation of the chip enable signal /CE without the refresh operation (when the EXTZ signal is at a low level and the CRWZ signal is at the high level), the burst clock signal BCLK starts being output 4 clocks behind the access command. The read latency RL is "5 (the standard value)" and the write latency WL is "4" (the standard value)".

When the access operation accompanied only by the column operation is performed in response to the activation of the chip enable signal /CE without the refresh operation (when the EXTZ signal is at the low level and the CRWZ signal is at the high level), the burst clock signal BCLK starts being output 1 clock behind the access command. The read latency RL is "2 (the standard value)" and the write latency WL is "1 (the standard value)".

Figure 4:
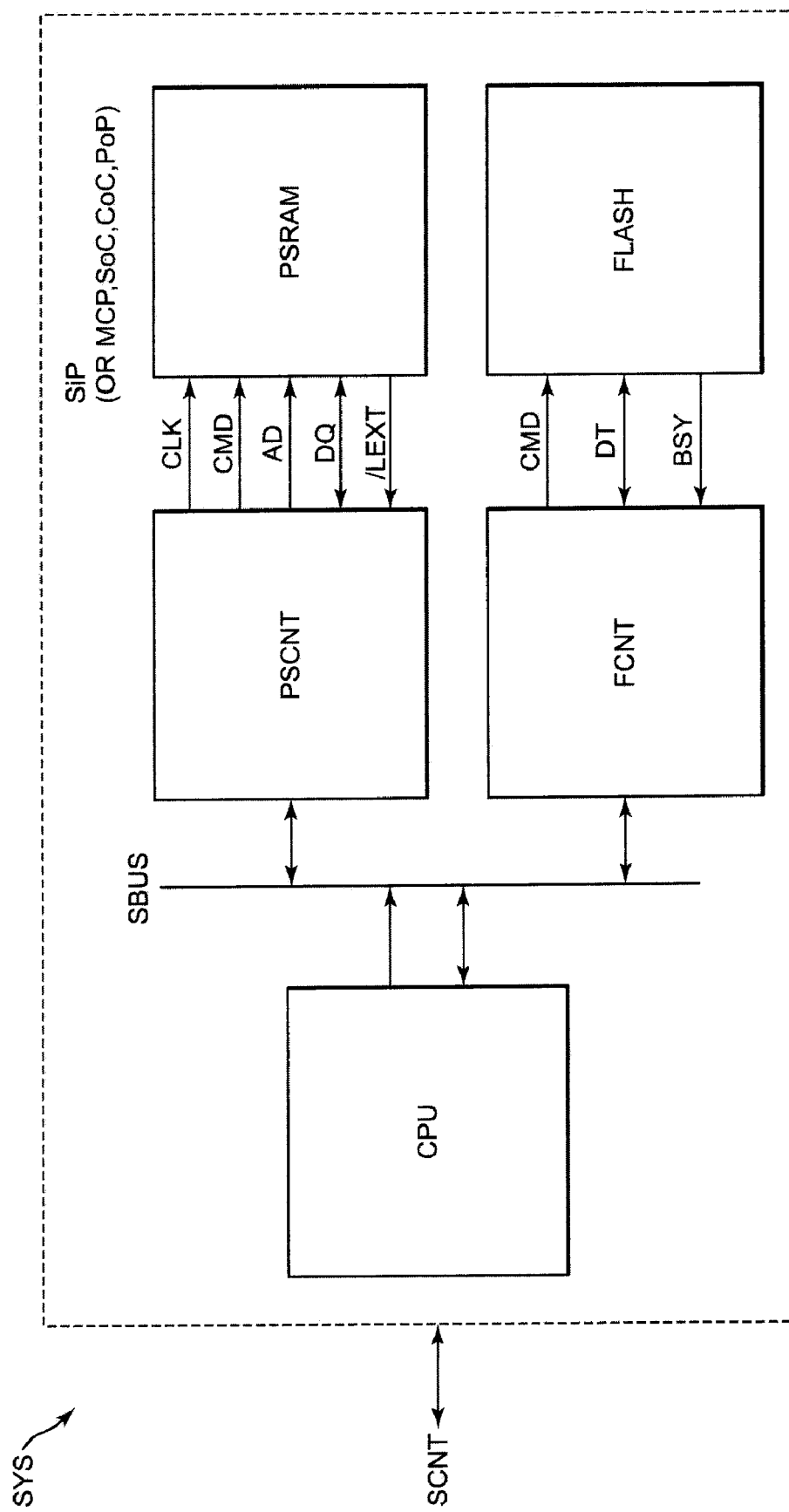
FIG. 4 shows an exemplary system on which a PSRAM is provided.

FIG. 4 shows an exemplary system SYS on which the PSRAM is provided. For example, the system SYS is a portable device such as a mobile phone or the like. Note that embodiments disclosed below are also provided on the system shown in FIG. 4. The system SYS includes a System in Package (SiP) in which a plurality of chips are provided on a package substrate such as a lead frame or the like. Alternatively, the system SYS includes a Multi-Chip Package (MCP) in which a plurality of chips are stacked on the package substrate. Alternatively, the system SYS includes a System on Chip (SoC) in which a plurality of macros are integrated on the silicon substrate. Alternatively, the system SYS includes a Chip on Chip (CoC) or a Package on Package (PoP).

The Sip includes the PSRAM shown in FIG. 1, the memory controller PSCNT accessing the PSRAM, a flash memory FLASH, a memory controller FCNT accessing the flash memory FLASH, and a CPU (a controller) controlling an entire system. The CPU and the memory controllers PSCNT and FCNT are coupled with each other via a system bus SBUS. The Sip is coupled via an external bus SCNT to an upper system. The CPU outputs the command signal CMD, an address signal AD, and a write data signal DQ so as to access the PSRAM and the flash memory FLASH and receives the read data signal DQ from the PSRAM and the flash memory FLASH.

Figure 5:
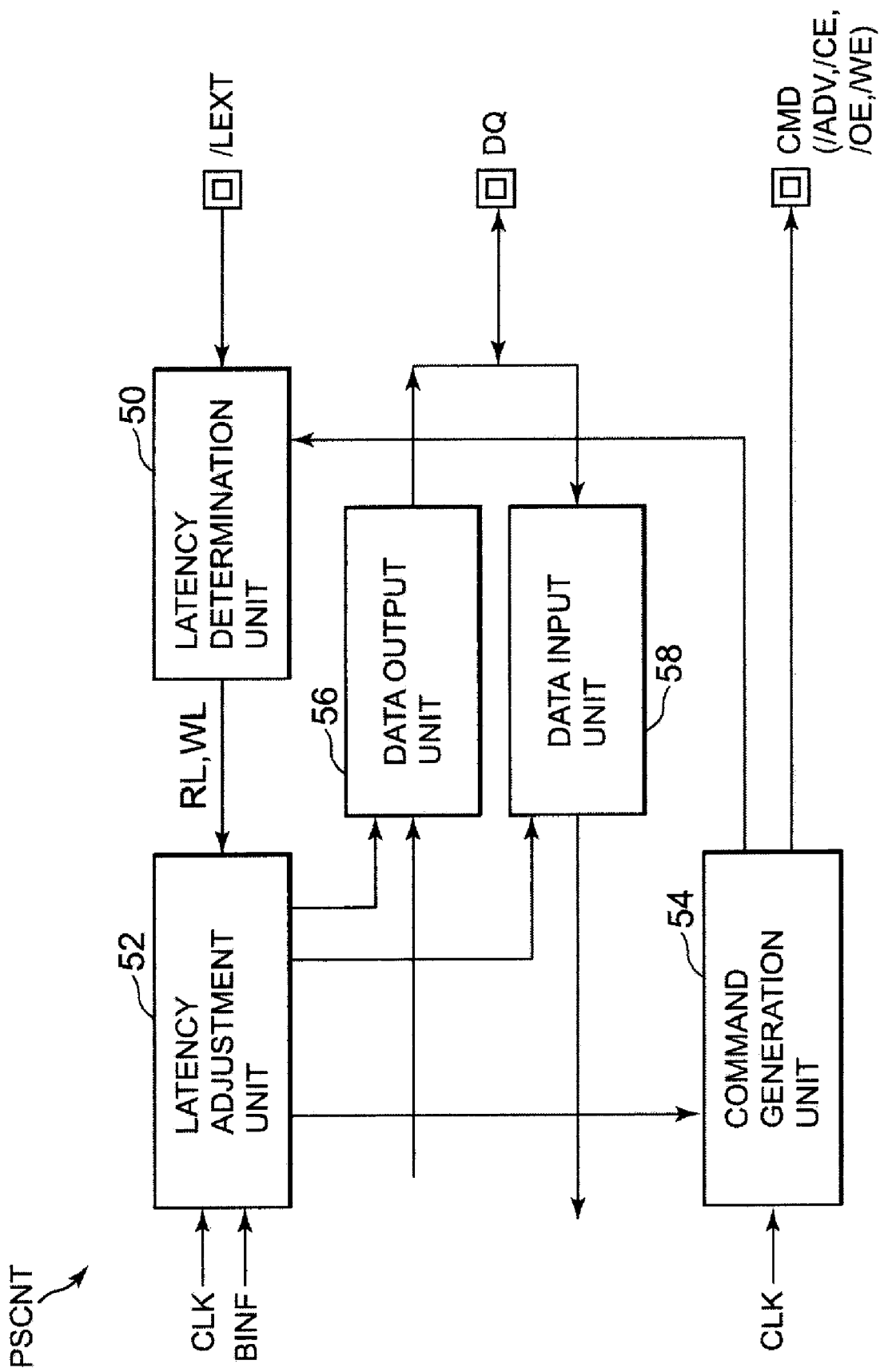
FIG. 5 shows an exemplary memory controller.

FIG. 5 shows the exemplary memory controller PSCNT shown in FIG. 4. The memory controller PSCNT includes a latency determination unit 50, a latency adjustment unit 52, a command generation unit 54, a data output unit 56, and a data input unit 58. The latency determination unit 50 outputs the read latency RL (a system read latency) and the write latency WL (a system write latency) based on the latency extension signal /LEXT from the PSRAM and command information from the command generation unit 54.

The system read latency indicates a time period (a certain number of clock cycles) between output of the read access request and receipt of the read data during the activation of the latency extension signal /LEXT. The system write latency indicates a time period (a certain number of clock cycles) between output of the write access request and output of the write data during the activation of the latency extension signal /LEXT.

The command information from the command generation unit 54 further includes two pieces of information, that is, the first information about whether the access request is accompanied by the row operation or not and the second information about whether the access request is the read request or the write request. The read latency RL and the write latency WL have the same values as that shown in FIG. 3. The latency determination unit 50 previously includes information on the read latency RL and the write latency WL of the PSRAM.

The latency adjustment unit 52 outputs control signals controlling the command generation unit 54, data output unit 56, and the data input unit 58 in synchronization with the clock signal CLK, based on burst information BINF indicating the burst length BL, the read latency RL and the write latency WL from the latency determination unit 50. The latency determination unit 50 and the latency adjustment unit 52 increase the system read latency during the activation of the latency extension signal /LEXT in comparison with the latency extension signal /LEXT during deactivation thereof. The latency determination unit 50 and the latency adjustment unit 52 increase the system write latency during the activation of the latency extension signal /LEXT in comparison with the latency extension signal /LEXT during the deactivation thereof.

The command generation unit 54 outputs the command signal CMD in accordance with the burst length BL, the variable read latency RL and the variable write latency WL in response to the control signal from the latency adjustment unit 52 and outputs the control signal to the data output unit 56 and the data input unit 58.

The data output unit 56 outputs the write data to the data terminal DQ based on an instruction from the latency adjustment unit 52 and the command generation unit 54. The data input unit 58 receives the read data from the data terminal DQ, based on the instruction from the latency adjustment unit 52 and the command generation unit 54.

Figure 6:
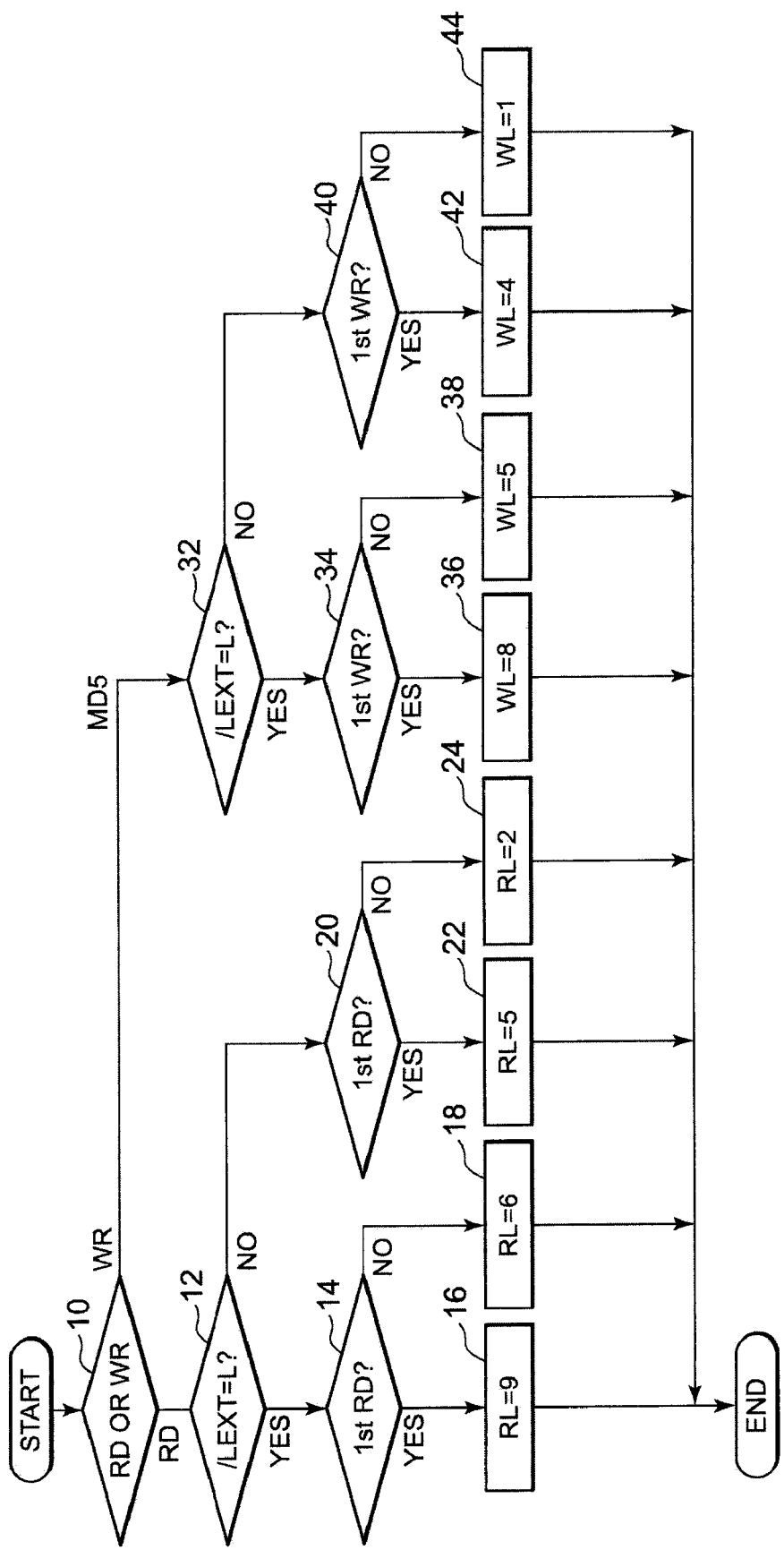
FIG. 6 shows an exemplary operation of a latency determination unit.

FIG. 6 shows an exemplary operation of the latency determination unit 50 shown in FIG. 5. The latency determination unit 50 may include a logic circuit or may be software.

In operation 10, the latency determination unit 50 determines based on the information from the command generation unit 54 which of the read command RD and the write command WR has been supplied to the PSRAM. When the read command RD has been supplied, a process proceeds to operation 12. When the write command WR has been supplied, the process proceeds to operation 32.

In operation 12, the latency determination unit 50 determines whether or not the extension signal /LEXT from the PSRAM is at the low level. When the extension signal /LEXT is at the low level, it is determined that the refresh operation has been inserted and the process proceeds to operation 14. When the extension signal /LEXT is at the high level, it is determined that the refresh operation has not been inserted and the process proceeds to operation 20.

In operation 14, the latency determination unit 50 determines based on the information from the command generation unit 54 whether or not the read operation is accompanied by the row operation (whether a first read command 1st RD or not). When the read operation is accompanied by the row operation, the process proceeds to operation 16. When the read operation is not accompanied by the row operation, the process proceeds to operation 18. In operation 16, the read latency RL is set to "9". In operation 18, the read latency RL is set to "6".

In operation 20, it is determined whether or not the read operation is accompanied by the row operation in the same manner as previously disclosed operation 14. In operation 22 and operation 24, the read latency RL is set to "5" and "2", respectively.

When the write command WR is supplied, a logic level of the extension signal /LEXT is determined in operation 32. In operation 34 and operation 40, it is determined whether or not the write operation is accompanied by the row operation. In operations 36, 38, 42, and 44, the write latency WL is set in response to operating states of the PSRAM.

Figure 7:
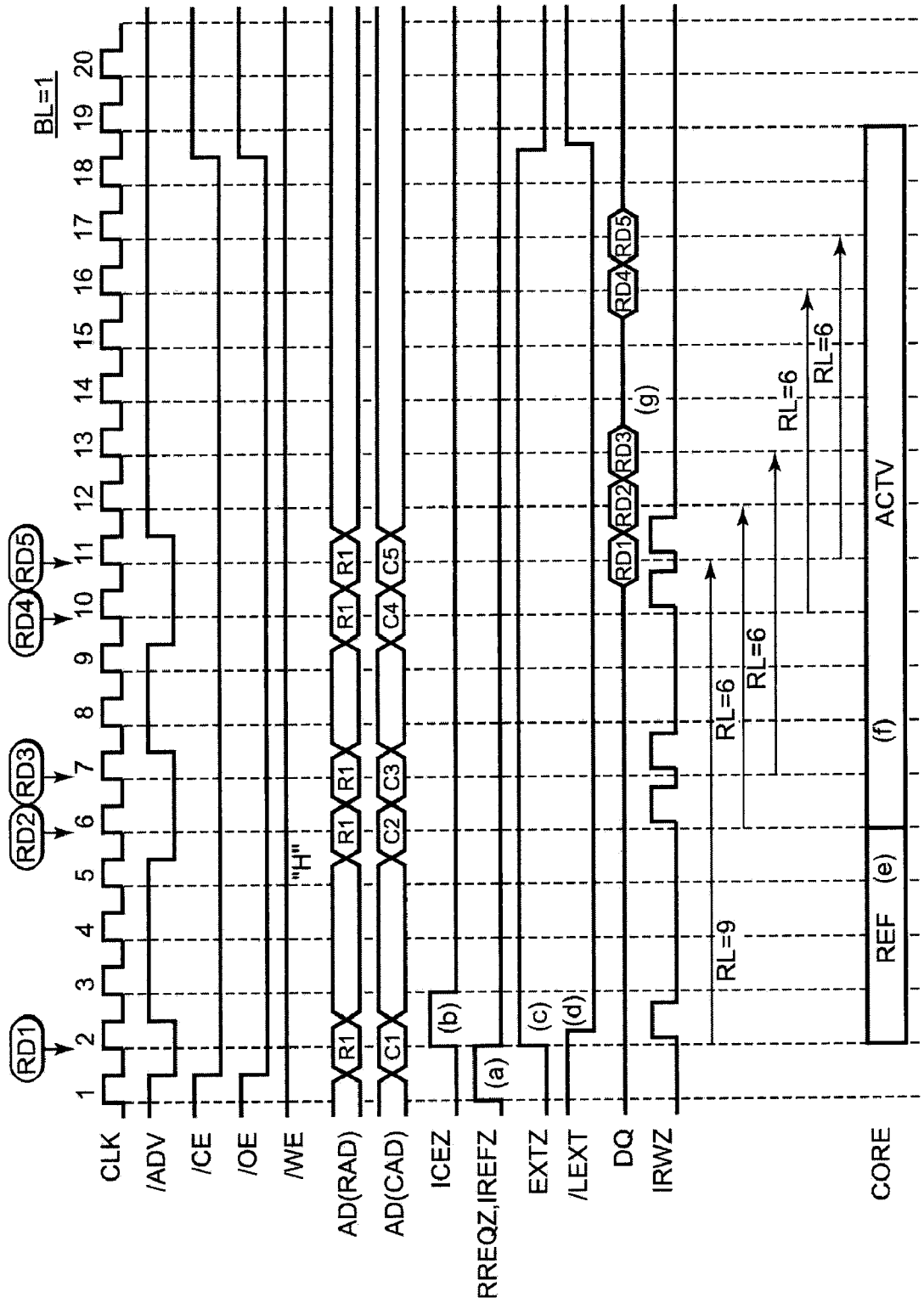
FIG. 7 shows an exemplary operation of the PSRAM.

FIG. 7 shows an exemplary operation of the PSRAM shown in FIG. 1. Read commands RD1 to RD5 are sequentially supplied to the PSRAM from the memory controller PSCNT and a page read operation is performed. Immediately before the first read command RD1 is supplied, the refresh request signal RREQZ (IREFZ) is activated (FIG. 7(a)). The burst length BL is set to "1".

The page read operation indicates an operation in which any of the data read from the memory cell MC, which is coupled to a single word line WL1, and latched by the sense amplifier SA is selected with the column address CAD and is read. The word line WL1 is kept activated in the page operation, and due to this, the chip enable signal /CE also needs to be kept activated. To periodically perform the refresh operations, for example, the maximum activation period of the word line WL1 is set to 10 ms which is equal to the cycle of the refresh request signal RREQZ.

The read commands RD1 to RD5 are recognized in response to the /OE signal attaining the low level during the activation of the /ADV signal and /CE signal (the /WE signal is at a high level). At least 4 clock cycles are necessary for a period between the read command RD1 supplied along with a falling edge of the chip enable signal /CE and the next read command RD2 so as to perform the row operation. A value of the burst length BL plus (+) 3 or more clock cycles are necessary for the period between the read command RD1 and the read command RD2. The second and the subsequent read commands RD (RD2, RD3, or the like) are supplied once in a certain number of clock cycles, the number of which is equal to the value of the burst length BL (in this embodiment, 1 clock cycle).

The command decoder 16 shown in FIG. 2 activates the internal read-write signal IRWZ in response to each of the read commands RD1-RD1. The memory controller PSCNT outputs the row address signal RAD and the column address signal CAD to the PSRAM along with the read commands RD1 to RD5. The row address signal RAD (R1) indicates a common row address for performing the page operations. The column address signals CAD (C1 to C5) indicate respectively different column addresses for performing the page operations.

The command decoder 16 shown in FIG. 2 activates the internal chip enable signal ICEZ in response to the activation of the chip enable signal /CE (FIG. 7(b)). Since the refresh request signal IREFZ has been activated prior to the internal chip enable signal ICEZ, the latency determination unit 50 in FIG. 4 activates the extension signal EXTZ (FIG. 7(c)). The latency output buffer 20 in FIG. 1 activates the latency extension signal /LEXT in response to the activation of the extension signal EXTZ (FIG. 7(d)). The extension signal EXTZ and the latency extension signal /LEXT are kept activated until the chip enable signal /CE is deactivated and the page read operation is completed. Consequently, as shown in FIG. 3, the read latency RL is "9" when the read latency is accompanied by the row operation. The read latency RL is "6" when the read latency is not accompanied by the row operation.

The arbiter ARB (FIG. 2) of the command decoder 16 shown in FIG. 1 activates the refresh signal REFZ in response to the refresh request signal RREQZ and temporarily holds the read command RD1. The operation control unit 24 in FIG. 1 starts a refresh operation REF of the memory core CORE in response to the refresh signal REFZ (FIG. 7(e)). The arbiter ARB activates the read signal RDZ (not shown) in response to completion of the refresh operation REF. The operation control unit 24 activates the word line WL1 indicated by the row address signal RAD in response to the read signal RDZ and activates the sense amplifier SA. An active operation ACTV of the memory core CORE is started (FIG. 7(f)).

The data register DREG shown in FIG. 1 outputs the read data RD1 to RD5 in synchronization with the burst clock BCLK shown in FIG. 3. The read data RD1 to RD5 are output to the data terminal DQ in synchronization with the clock signal CLK corresponding to the read latency RL (FIG. 7(g)).

Figure 8:
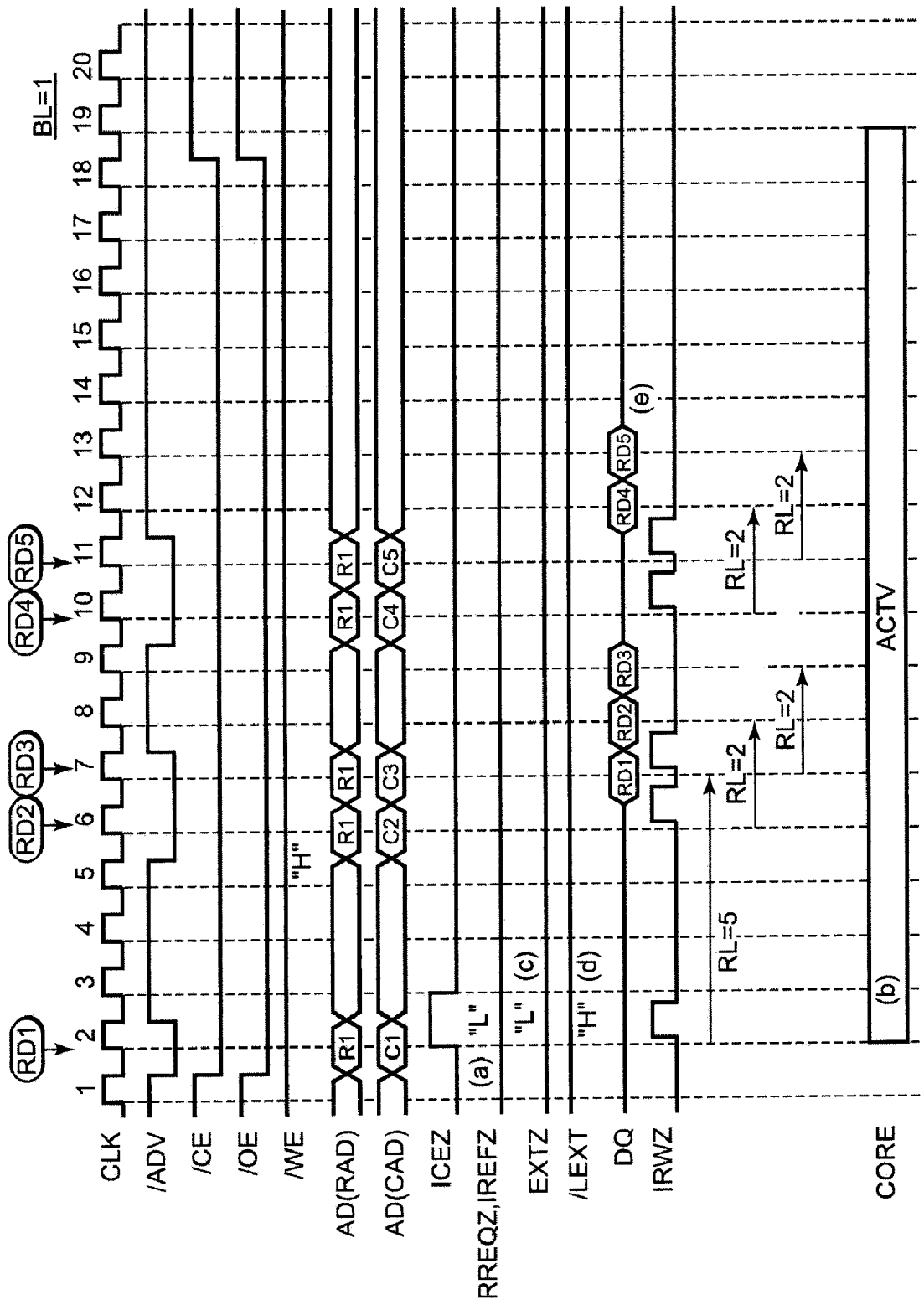
FIG. 8 shows another exemplary operation of the PSRAM.

FIG. 8 shows another exemplary operation of the PSRAM. In FIG. 8, the read commands RD1 to RD5 are sequentially supplied to the PSRAM from the memory controller PSCNT at the same timing as that shown in FIG. 7 and a page read operation is performed. The memory controller PSCNT supplies the signal to the PSRAM at the same timing as that shown in FIG. 7. The burst length BL is set to "1".

Upon the first read command RD1 being supplied, the refresh request has not been generated and the refresh request signal RREQZ (IREFZ) remains deactivated (FIG. 8(a)). The arbiter ARB activates the read signal RDZ in response to the read command RD1. Since the operation control unit 24 performs the read operation of the memory core CORE in response to the read signal RDZ, the operation control unit 24 activates the word line WL1 indicated by the row address signal RAD and activates the sense amplifier SA. The active operation ACTV of the memory core CORE is started (FIG. 8(b)).

The latency determination unit 50 shown in FIG. 5 keeps the extension signal EXTZ deactivated (FIG. 8(c)). The latency output buffer 20 keeps the latency extension signal /LEXT deactivated (FIG. 8(d)). As shown in FIG. 3, the read latency RL is "5" when the read latency RL is accompanied by the row operation. When the read latency RL is not accompanied by the row operation, the read latency RL is "2". The read data RD1 to RD5 are output to the data terminal DQ in synchronization with the clock signal CLK corresponding to the read latency RL shown in FIG. 3 (FIG. 8(e)).

In the operations of the PSRAM shown in FIGS. 7 and 8, each of the second and the subsequent read commands RD2 to RD5 are supplied at the same timing regardless of whether the refresh operation REF is inserted or not. A difference between the read latency RL (=9) of the first read command RD1 and the read latency RL (=6) of the second and the subsequent read commands RD2 to RD5 where the refresh operation REF is inserted is set to the same value ("3" in this embodiment) as a difference between the read latency RL (=5) of the first read command RD1 and the read latency RL (=2) of the second and the subsequent read commands RD2 to RD5 where the refresh operation REF is not inserted, thereby allowing the commands to be supplied at the same timing. Even if the write commands WR are supplied subsequent to the first read command RD1, the difference in the latencies is set equal regardless of whether or not the refresh operation REF is inserted, thereby allowing the commands to be supplied at the same timing regardless of whether or not the refresh operation REF is inserted.

The memory controller PSCNT may change only the timing of receipt of the read data depending on whether or not the refresh operation is inserted. Since the memory controller PSCNT does not need to change the timing of outputting the second and the subsequent read commands RD2 to RD5, the memory controller PSCNT may have some leeway in terms of the operation thereof. For example, since the command generation unit 54 shown in FIG. 5 may operate at the same timing regardless of whether or not the refresh operation is inserted, some leeway is provided in terms of the timing of the command supply.

Figure 9:
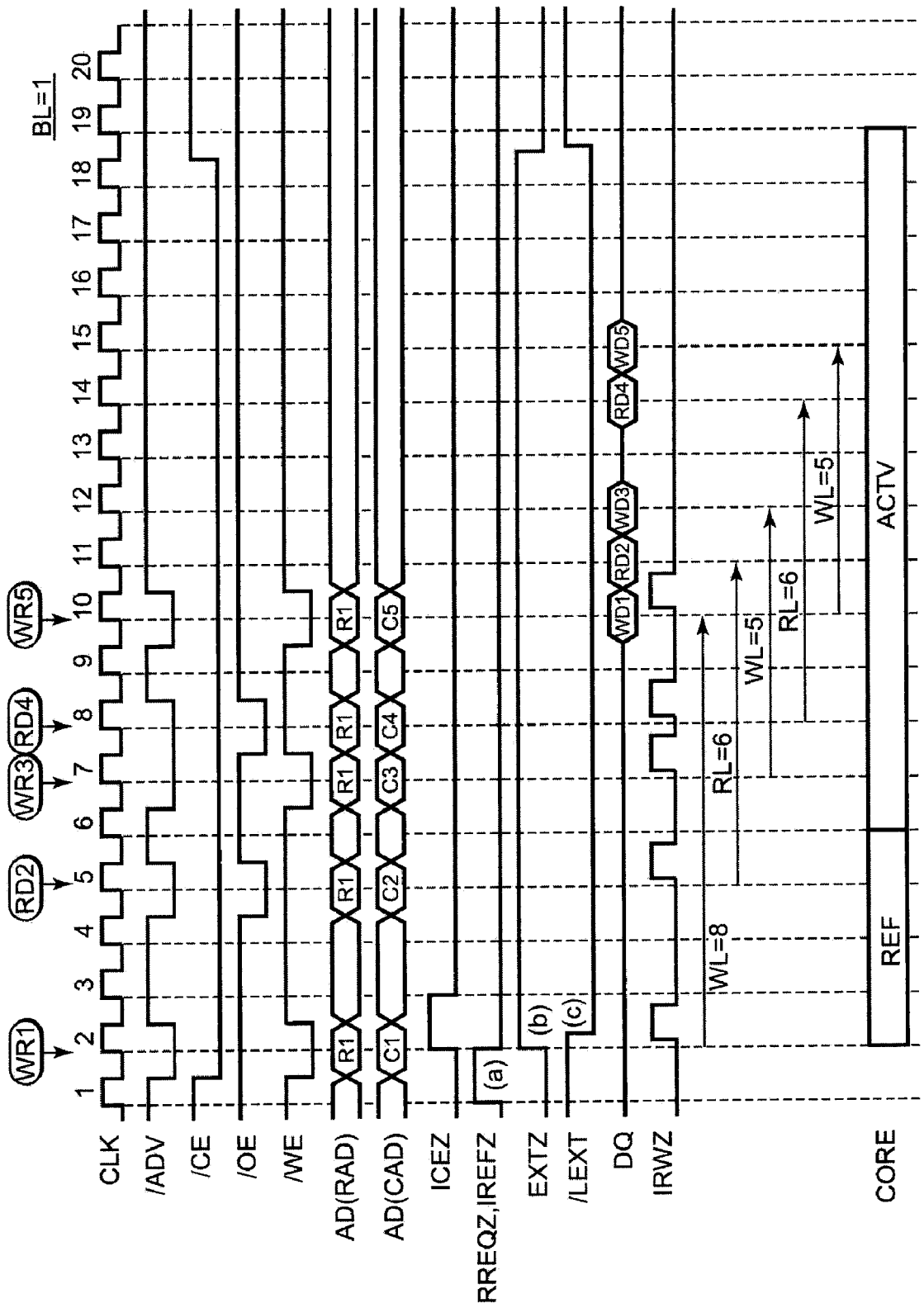
FIG. 9 shows yet another exemplary operation of the PSRAM.

FIG. 9 shows yet another exemplary operation of the PSRAM shown in FIG. 1. In FIG. 9, the write command and the read command are supplied in a mixed manner from the memory controller PSCNT and the page operation is performed. The burst length BL is set to "1". The write command WR is recognized in response to the /WE signal attaining the low level during the activation of the /ADV signal and the /CE signal (The /OE signal is at the low level.).

As an interval between the write command WR1 supplied along with a falling edge of the chip enable signal /CE and the next read command RD2, at least 3 clock cycles are necessary so as to perform the row operation. The value of the burst length BL plus (+) 2 or more clock cycles are necessary for an interval between the write command WR1 and the read command RD2. Due to the write latency WL that is one (1) clock cycle less than the read latency RL, the interval shown in FIG. 9 is one clock less than the interval shown in FIG. 7.

At least one (1) clock cycle is necessary for the interval between the second and the subsequent read commands RD and the write command WR in order to prevent a conflict between the read data RD and the write data WD generated based on the difference between the latency WL and the latency RL. The plurality of the second and the subsequent read commands RD are supplied on a clock cycle basis. The plurality of the second and the subsequent write commands WD are also supplied on a clock cycle basis. The second and the subsequent write commands WD and the read commands RD are sequentially supplied.

The refresh request signal RREQZ (IREFZ) is activated immediately before the first write command WR1 is supplied (FIG. 9(a)). In the same manner as shown in FIG. 7, the extension signal EXTZ is activated (FIG. 9(b)) and the latency extension signal /LEXT is activated (FIG. 9(c)). As shown in FIG. 3, the write latency WL is "8" when the write latency WL is accompanied by the row operation. When the write latency WL is not accompanied by the row operation, the write latency WL is "5". The read latency RL is the same as the read latency shown in FIG. 7.

When the refresh operation REF is not inserted, the timing of supplying the write data WD to the data terminal DQ and the timing of outputting the read data RD from the data terminal DQ are changed. The write latency WL and the read latency RL decreases by "4". The timing of supplying the commands WR1, RD2, WR3, RD4, and WR5 may be made equal to the timing of supply shown in FIG. 9. A difference between the write latency WL (=8) of the first write command WR1 and the latency RL (=6) of the second and the subsequent read commands RD2 and RD4 where the refresh operation REF is inserted is set to the same value ("2" in this embodiment) as a difference between the write latency WL (=4) of the first write command WD1 and the read latency RL (=2) of the second and the subsequent read commands RD2 and RD4 where the refresh operation REF is not inserted, thereby allowing the commands to be supplied at the same timing. A difference between the latency WL (=8) of the first write command WR1 and the write latency WL (=5) of the second and the subsequent write commands WR3 and WR5 where the refresh operation REF is inserted is set to the same value ("3" in this embodiment) as a difference between the latency WL of the first write command WR1 (=4) and the read latency RL (=1) of the second and the subsequent write commands WR3 and WR5 where the refresh operation REF is not inserted, thereby allowing the commands to be supplied at the same timing.

The memory controller PSCNT may change only the timing of outputting the write data and the timing of receiving the read data depending on whether or not the refresh operation is inserted. That is, the memory controller PSCNT does not need to change the timing of outputting the second and the subsequent commands RD2 to RD5. In consequence, some leeway is available for the memory controller PSCNT in terms of the operation thereof and thus some leeway is available in terms of the timing of supplying the commands.

Figure 10:
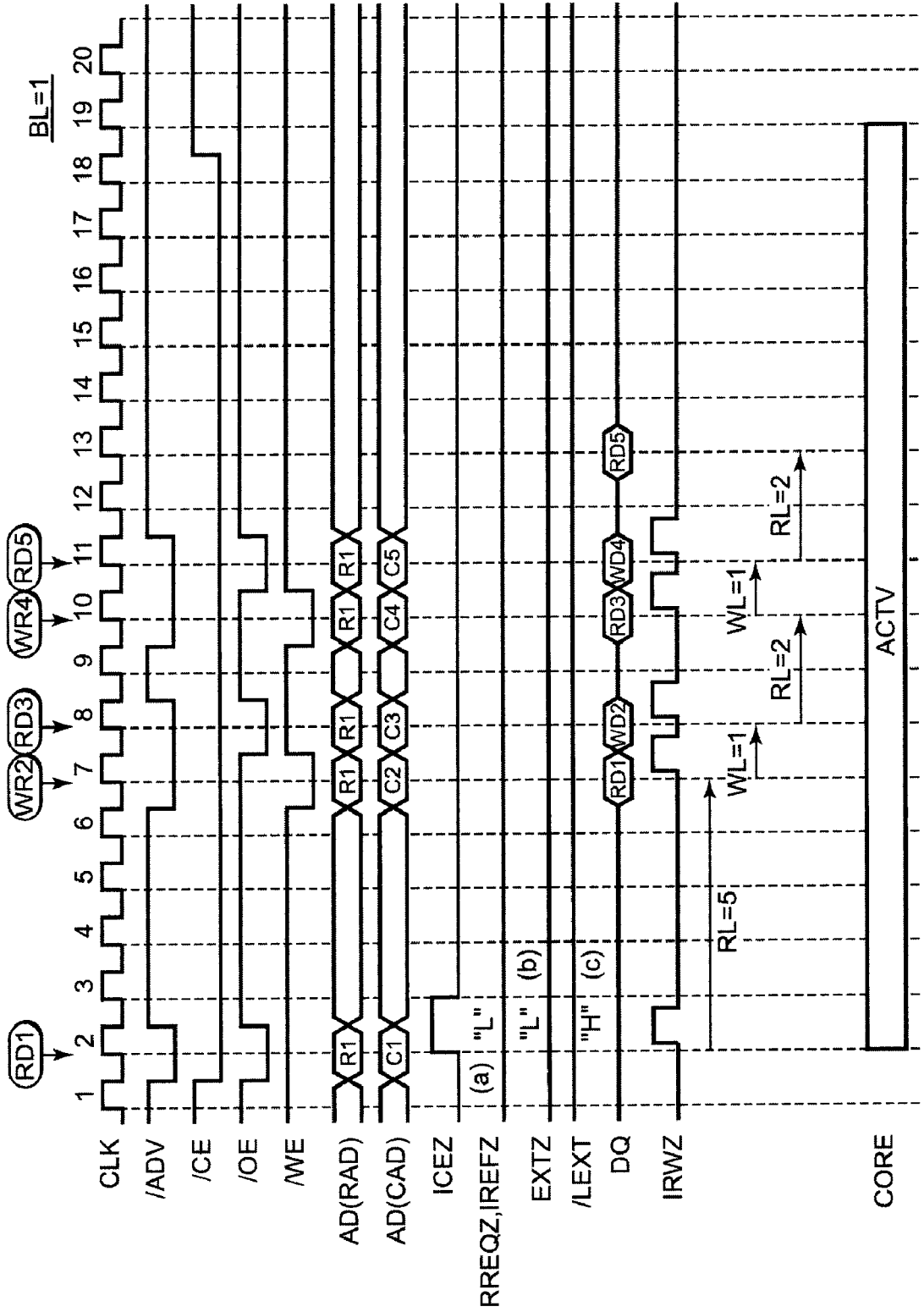
FIG. 10 shows yet another exemplary operation of the PSRAM.

FIG. 10 shows yet another exemplary operation of the PSRAM in FIG. 1. In the operation of the PSRAM in FIG. 10, the read command and the write command are supplied from the memory controller PSCNT in a mixed manner and the page operation is performed. The burst length BL is set to "1".

At least one (1) clock cycle is necessary for an interval between the second and the subsequent read commands RD and write commands WR. As an interval between the read command RD1 supplied along with a falling edge of the chip enable signal /CE and the next write command WR2, 5 clock cycles that is one (1) clock cycle more than the interval shown in FIG. 7 are necessary. As an interval between the read command RD1 and the write command WR2, the value of the burst length BL plus (+) 4 or more clock cycles are necessary.

Upon the first read command RD1 being supplied, the refresh request has not been generated and the refresh request signal RREQZ (IREFZ) is being deactivated (FIG. 10(a)). The latency determination unit 50 shown in FIG. 5 keeps the extension signal EXTZ deactivated (FIG. 10(b)). The latency output buffer 20 shown in FIG. 1 keeps the latency extension signal /LEXT deactivated (FIG. 10(c)). As shown in FIG. 3, the write latency WL is "5" when the write latency WL is accompanied by the row operation. When the write latency WL is not accompanied by the row operation, the write latency WL is "1". The read latency RL is the same as the read latency shown in FIG. 8.

Figure 11:
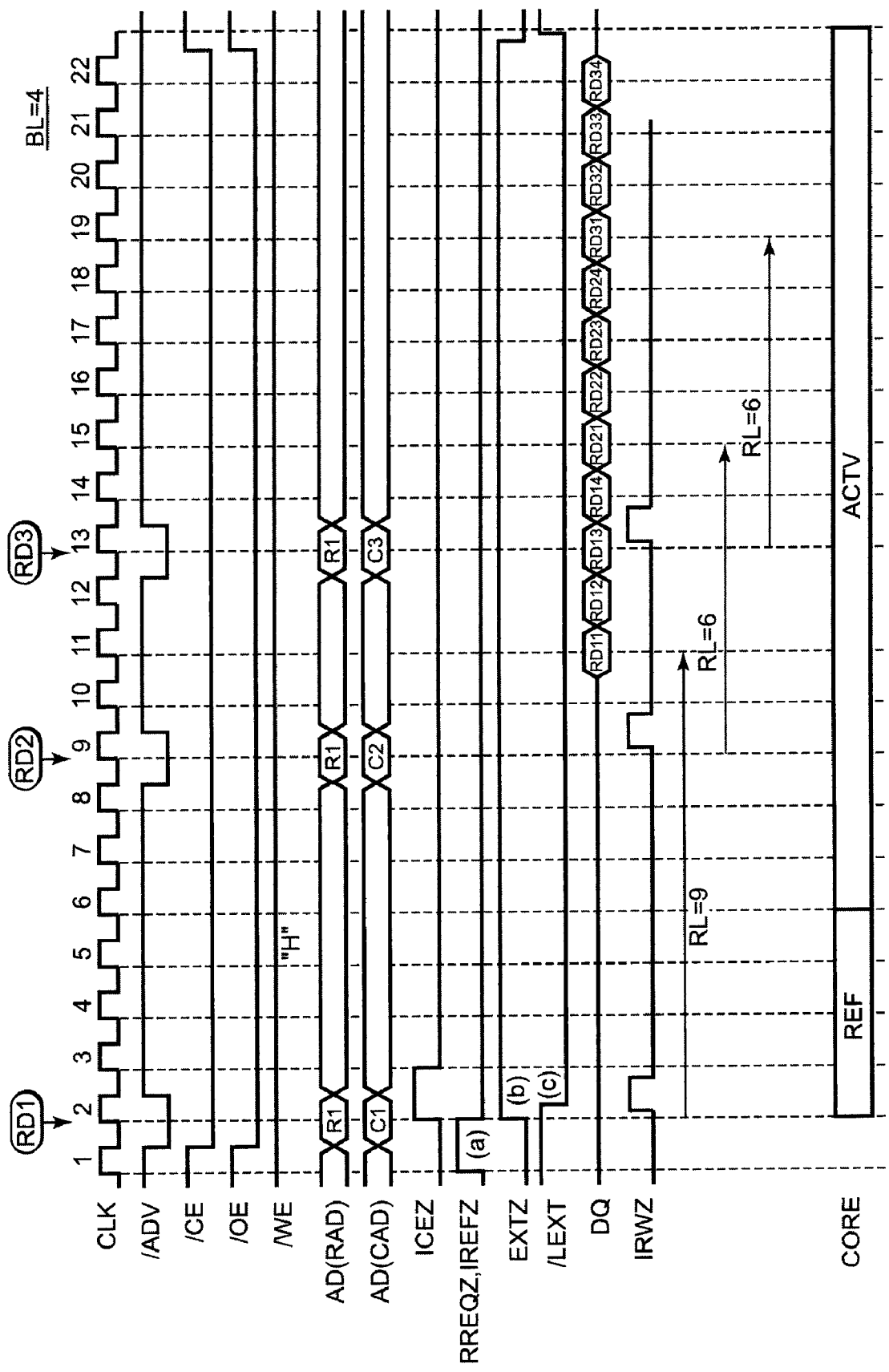
FIG. 11 shows yet another exemplary operation of the PSRAM.

FIG. 11 shows yet another exemplary operation of the PSRAM shown in FIG. 1. In the operation of the PSRAM shown in FIG. 11, the read commands RD1 to RD3 are sequentially supplied from the memory controller PSCNT and the page operation is performed. The burst length BL is set to "4".

A minimum interval between the read commands RD1 and RD2 is the value of the burst length BL plus (+) 3 clock cycles (that is to say, 7 clock cycles). An interval between the read commands RD2 and RD3 becomes a certain number of clock cycles, the number of which is equal to the value of the burst length BL (in this embodiment, 4 clock cycles).

The refresh request signal RREQZ (IREFZ) is activated immediately before the first read command RD1 is supplied (FIG. 11(a)). Consequently, in the same manner as shown in FIG. 7, the extension signal EXTZ is activated (FIG. 11(b)) and the latency extension signal /LEXT is activated (FIG. 11(c)).

In the same manner as shown in FIG. 7, the read latency RL is "9" when the read latency is accompanied by the row operation. When the read latency RL is not accompanied by the row operation, the read latency RL is "6".

The latency extension signal /LEXT is held at a constant level during the activation of the chip enable signal /CE, whereby the read latency RL or the write latency WL corresponding to the column access command in the page operation is prevented from being changed regardless of whether or not the refresh operation REF is inserted.

Since the timing of supplying the column access command to the PSRAM becomes the same regardless of whether or not the refreshing operation REF is inserted, some leeway may be provided for the operation of the memory controller PSCNT and some leeway may be provided for the timing of supplying the commands. Even if the clock signal CLK has a high frequency, the read command RD and the write command WR are reliably supplied to the PSRAM. Consequently, the supply of the column access commands from the memory controller PSCNT to the PSRAM at wrong timing may be prevented. Thus, a malfunction of the PSRAM may be prevented.

Figure 12:
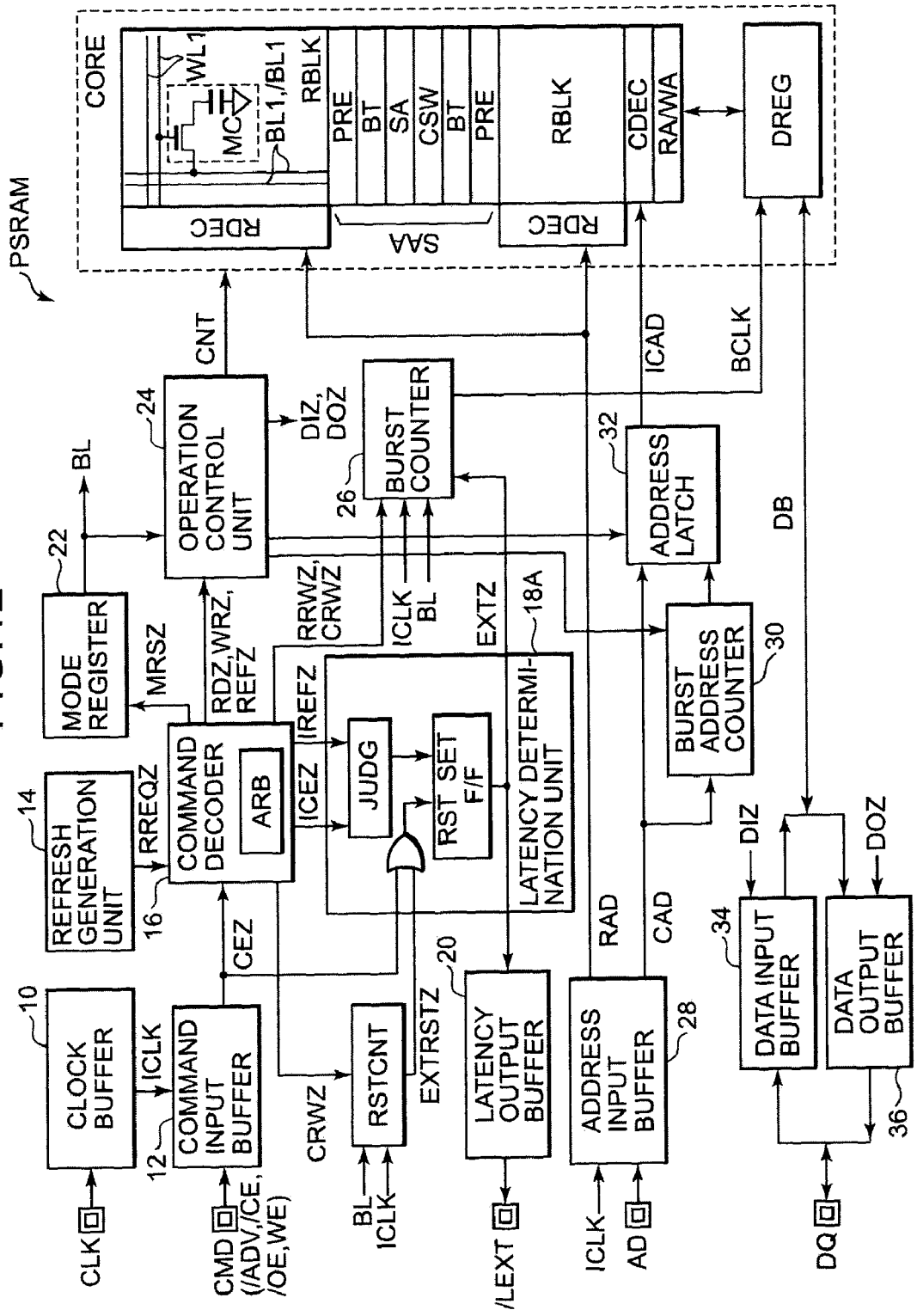
FIG. 12 shows a second embodiment.

FIG. 12 shows a second embodiment. In the second embodiment, the same numerical references as those shown in the first embodiment are given to the same elements and disclosure thereof will be reduced or omitted. A semiconductor memory shown in FIG. 12 is, for example, a PSRAM. The PSRAM in FIG. 12 includes a latency determination unit 18A instead of the latency determination unit 18 in FIG. 1. The PSRAM includes a reset control unit RSTCNT. The other structure of the PSRAM in FIG. 12 is the same as that shown in the first embodiment.

A flip-flop F/F of the latency determination unit 18A is reset upon receipt of a chip enable signal CEZ at a high level or an extension reset signal EXTRSTZ with a reset terminal RST and changes an extension signal EXTZ to a low level. If an interval between column read-write signals CRWZ supplied from the command decoder CDEC exceeds a certain period (the number of clock cycles obtained by adding clock cycles indicated by a burst length BL to 4 clock cycles), the reset control unit RSTCNT activates the extension reset signal EXTRSTZ. The reset control unit RSTCNT outputs the extension reset signal when follow-on access requests after the activation of a chip enable signal /CE are not supplied for a certain period.

Figure 13:
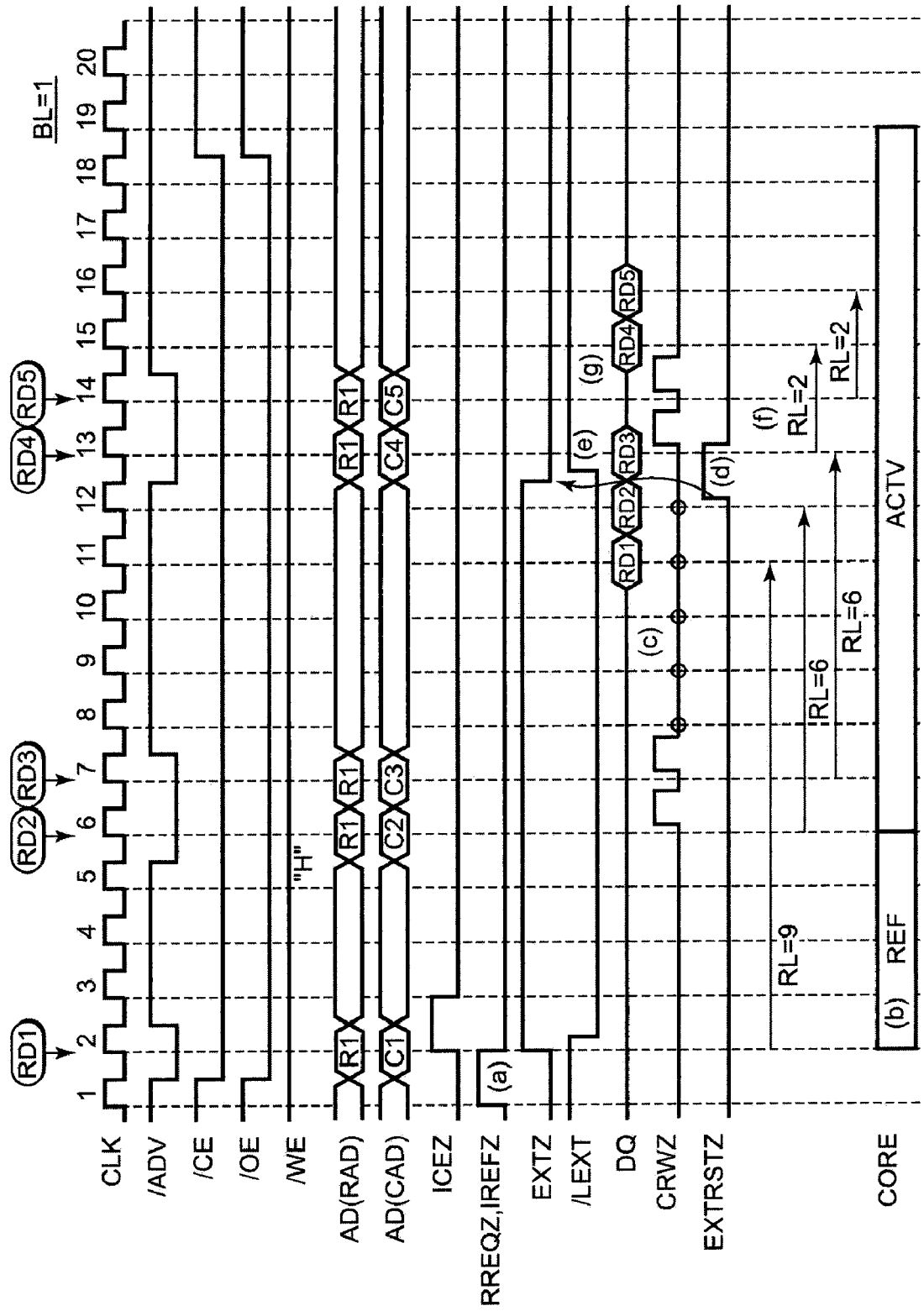
FIG. 13 shows an exemplary operation of a PSRAM.

FIG. 13 shows an exemplary operation of the PSRAM shown in FIG. 12.

In FIG. 13, read commands RD1 to RD5 read are sequentially supplied from a memory controller PSCNT to the PSRAM and a page read operation is performed. A refresh request signal RREQZ (IREFZ) is activated immediately before a first read command RD1 is supplied (FIG. 13(a)) and a refresh operation REF is performed before an access operation (FIG. 13(b)). A burst length BL is set to "1".

The reset control unit RSTCNT shown in FIG. 12 counts the number of clock cycles after receiving a column read-write signal CRWZ corresponding to the read command RD3 (FIG. 13(c)). The reset control unit RSTCNT temporarily activates the extension reset signal EXTRSTZ because the next read command or the next write command is not supplied in synchronization with a rising edge of a twelfth clock signal CLK (FIG. 13(d)). Based on the extension reset signal EXTRSTZ temporarily activated, the extension signal EXTZ is deactivated and a latency extension signal /LEXT is deactivated (FIG. 13(e)).

Based on the deactivation of the latency extension signal /LEXT, a read latency RL is reduced to "2" from "6" (FIG. 13(f)). This reduction improves not only a data transfer rate between the memory controller PSCNT and the PSRAM but also an access efficiency of the PSRAM. The operation without the refresh operation REF being inserted is the same as that shown in FIG. 8. The read latency RL of the first read command RD1 is "5" and the read latency RL of the second and the subsequent read commands RD2 to RD5 is "2".

Upon the read command RD4 being supplied in synchronization with a thirteenth clock signal CLK, the read data RD4 is output in synchronization with a fifteenth clock signal CLK (FIG. 13(g)). A period of one (1) clock cycle is generated in which data is not transferred to a data terminal DQ. Since write data is supplied to the data terminal DQ (a write latency WL=1) in synchronization with a fourteenth clock signal CLK when a write command WR is supplied in synchronization with the thirteenth clock signal CLK, one (1) clock cycle is necessary.

Even when the refresh operation REF is not inserted, the reset control unit RSTCNT counts the number of clock cycles and activates the reset signal EXTRSTZ. When the refresh operation is not inserted, the flip-flop F/F deactivates the extension signal EXTZ, thereby preventing a malfunction.

Figure 14:
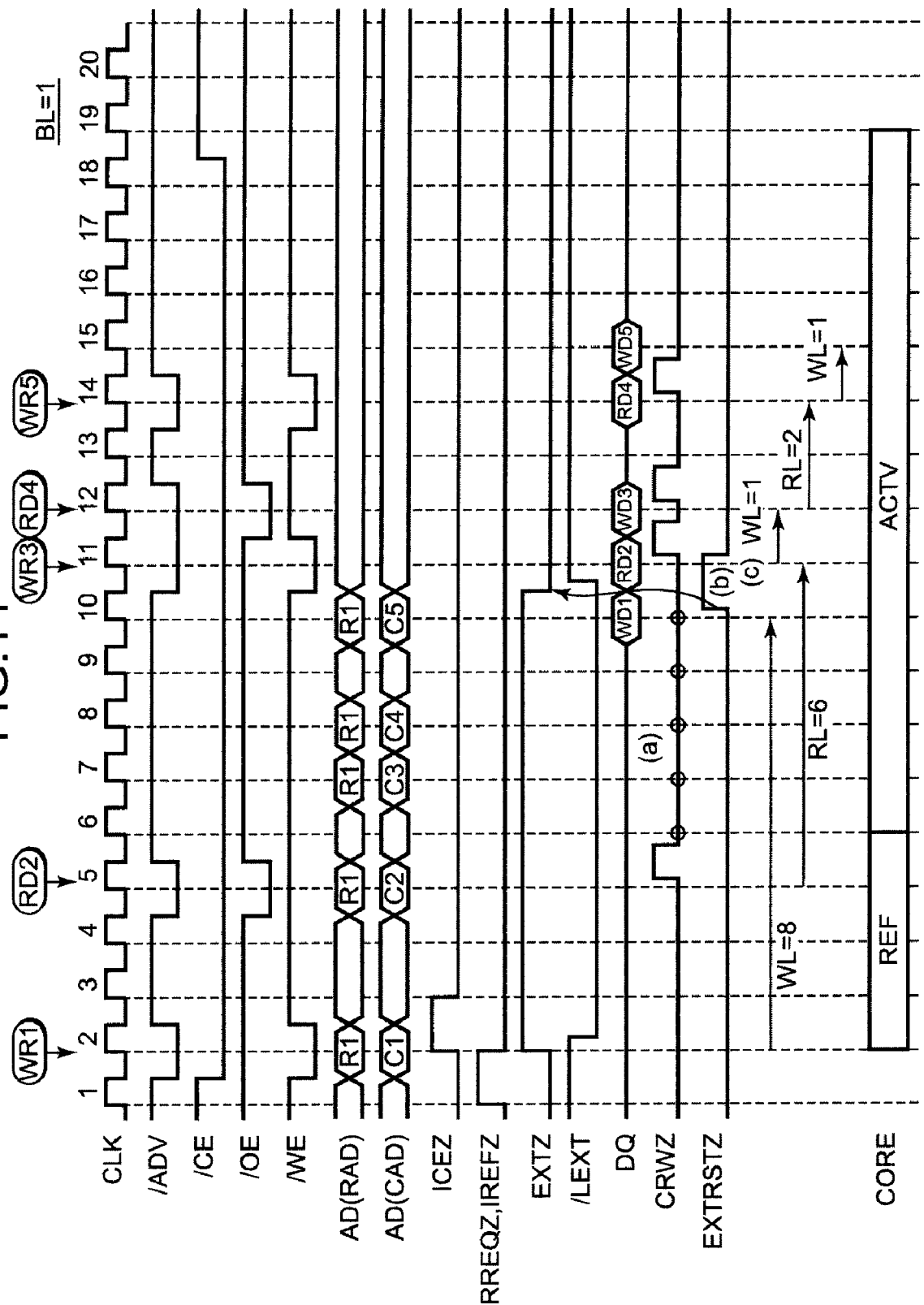
FIG. 14 shows another exemplary operation of the PSRAM.

FIG. 14 shows yet another exemplary operation of the PSRAM shown in FIG. 12. In the operation shown in FIG. 14, the write command and the read command are supplied from the memory controller PSCNT in a mixed manner and the page operation is performed. The burst length BL is set to "1". In the operation shown in FIG. 14, the refresh operation REF is inserted.

The reset control unit RSTCNT shown in FIG. 12 counts the number of clock cycles after receiving the column read-write signal CRWZ corresponding to the read command RD2 (FIG. 14(a)). The reset control unit RSTCNT temporarily activates the extension reset signal EXTRSTZ because the next read command or the next write command is not supplied in synchronization with a rising edge of a tenth clock signal CLK (FIG. 14(b)). In the same manner as the operation shown in FIG. 13, the read latency RL and the write latency WL are reduced based on the extension reset signal EXTRSTZ temporarily activated (FIG. 14(c)). The operation without the refresh operation REF being inserted is the same as that shown in FIG. 10. When the write command WR is supplied immediately after the latency is reduced, the read data RD2 and the write data WR3 are sequentially transferred to the data terminal DQ.

Figure 15:
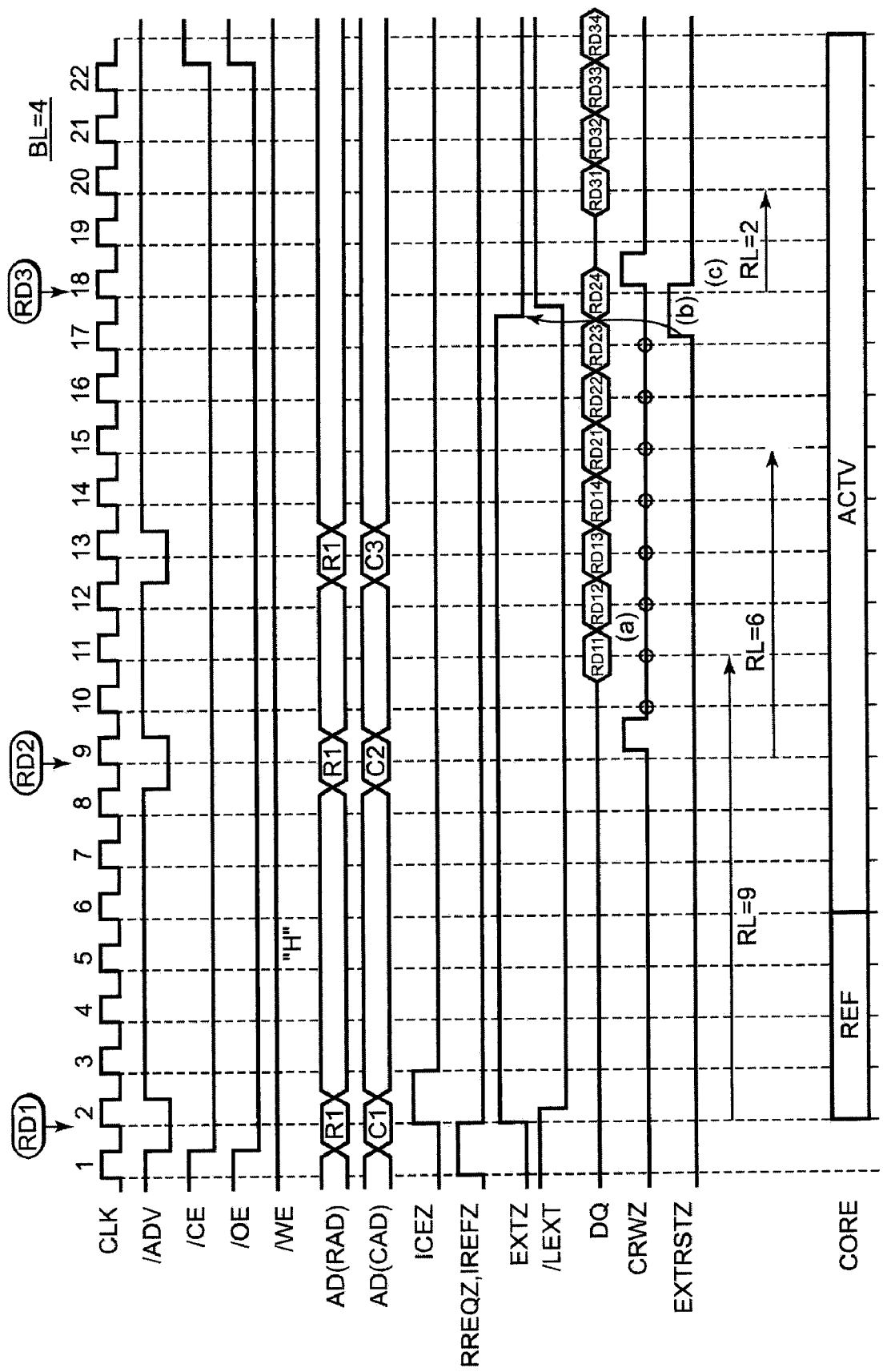
FIG. 15 shows yet another exemplary operation of the PSRAM.

FIG. 15 shows yet another exemplary operation of the PSRAM shown in FIG. 12. In the operation of the PSRAM shown in FIG. 15, the read commands RD1 to RD3 are sequentially supplied from the memory controller PSCNT and the page operation is performed. The burst length BL is set to "4". In the operation shown in FIG. 15, the refresh operation REF is inserted.

The reset control unit RSTCNT shown in FIG. 12 counts the number of clock cycles after receiving the column read-write signal CRWZ corresponding to the read command RD2 (FIG. 15(a)). The reset control unit RSTCNT temporarily activates the extension reset signal EXTRSTZ because the next read command or the next write command is not supplied in synchronization with a rising edge of a seventeenth clock signal CLK (FIG. 15(b)). When the burst length BL is "4" and the read command or the write command are not supplied for a period of 8 clock cycles, the read latency RL is reduced. Even when the burst lengths BL are different, the PSRAM shown in FIG. 12 does not malfunction. In the same manner as the operation shown in FIG. 13, the read latency RL is reduced in the PSRAM shown in FIG. 12 (FIG. 15(c)).

The second embodiment has the same advantages as those in the first embodiment. In the second embodiment, when the third and the subsequent access requests are not supplied for the certain period, the extension latency signal /LEXT is deactivated and the read latency RL or the write latency WL is reduced.

The read latency RL or the write latency WL is reduced, whereby data transfer rate between the memory controller PSCNT and the PSRAM is improved and, in addition, an access efficiency of the PSRAM is improved.

Since the number of clock cycles until the deactivation of the latency extension signal /LEXT may be changed in response to the burst length BL, a conflict between data signals DQ due to the change in the burst length BL may be prevented and a malfunction of the PSRAM may be effectively prevented.

Figure 16:
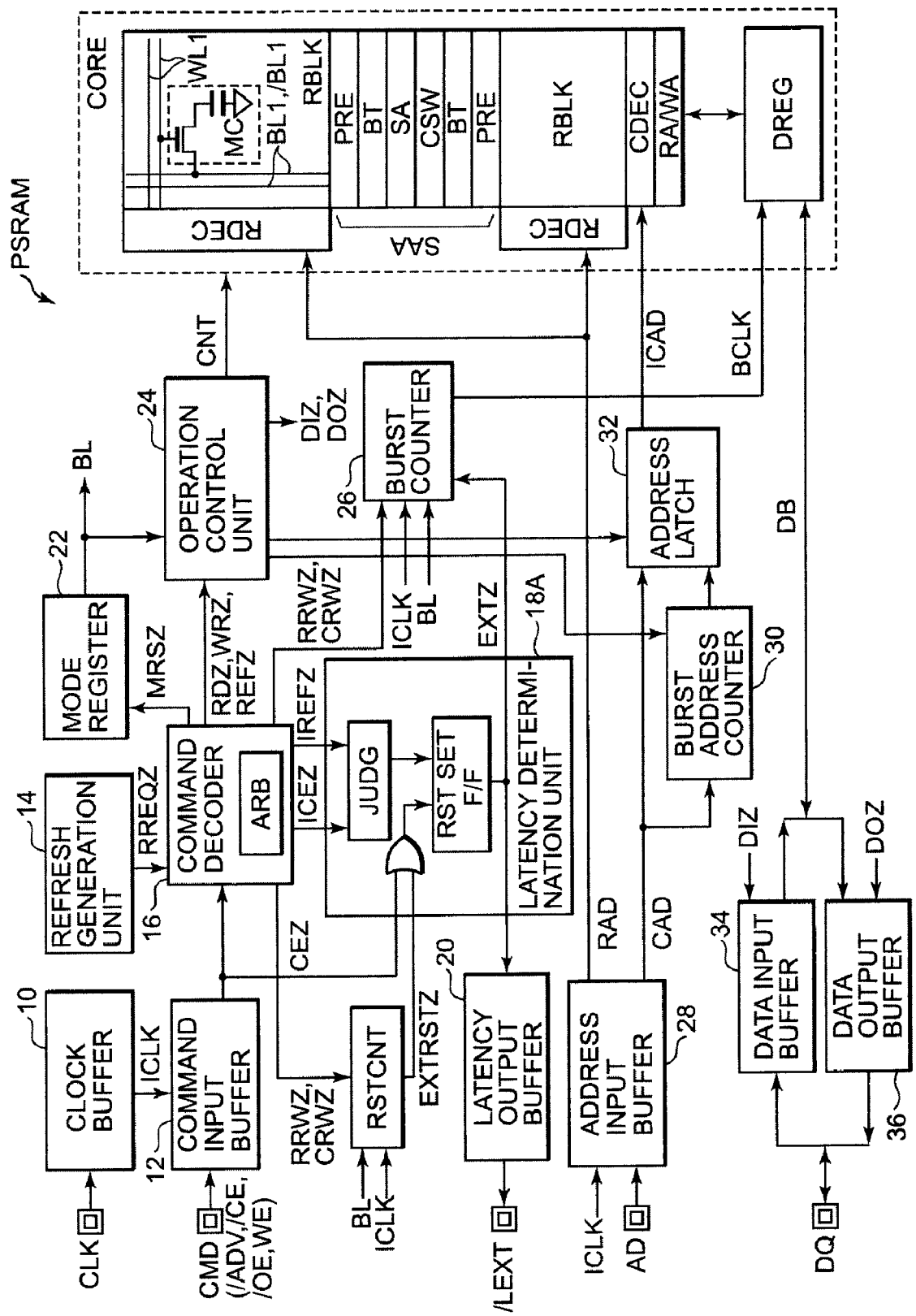
FIG. 16 shows a third embodiment.

FIG. 16 shows a third embodiment. In the third embodiment, the same numerical references as those shown in the first and the second embodiments are given to the same elements and the disclosure thereof will be reduced or omitted. A semiconductor memory shown in FIG. 16 is, for example, a PSRAM.

The PSRAM shown in FIG. 16 has a reset control unit RSTCNT that is different from the reset control unit RSTCNT in the PSRAM shown in FIG. 12. The other structure in FIG. 16 is the same as that shown in FIG. 12.

The reset control unit RSTCNT activates an extension reset signal EXTRSTZ when an interval between column read-write signals CRWZ exceeds a certain number of clock cycles, which is obtained by adding "4" to the number of clock cycles equal to a value of a burst length BL. The reset control unit RSTCNT activates the extension reset signal EXTRSTZ when an interval between row read-write signals RRWZ exceeds a certain number of clock cycles, which is obtained by adding "7" to the number of clock cycles equal to the value of the burst length BL. In the third embodiment, when a next access command is not supplied for a certain period after the supply of a first access command RD or WR supplied along with the chip enable signal /CE, the extension reset signal EXTRSTZ is activated.

Figure 17:
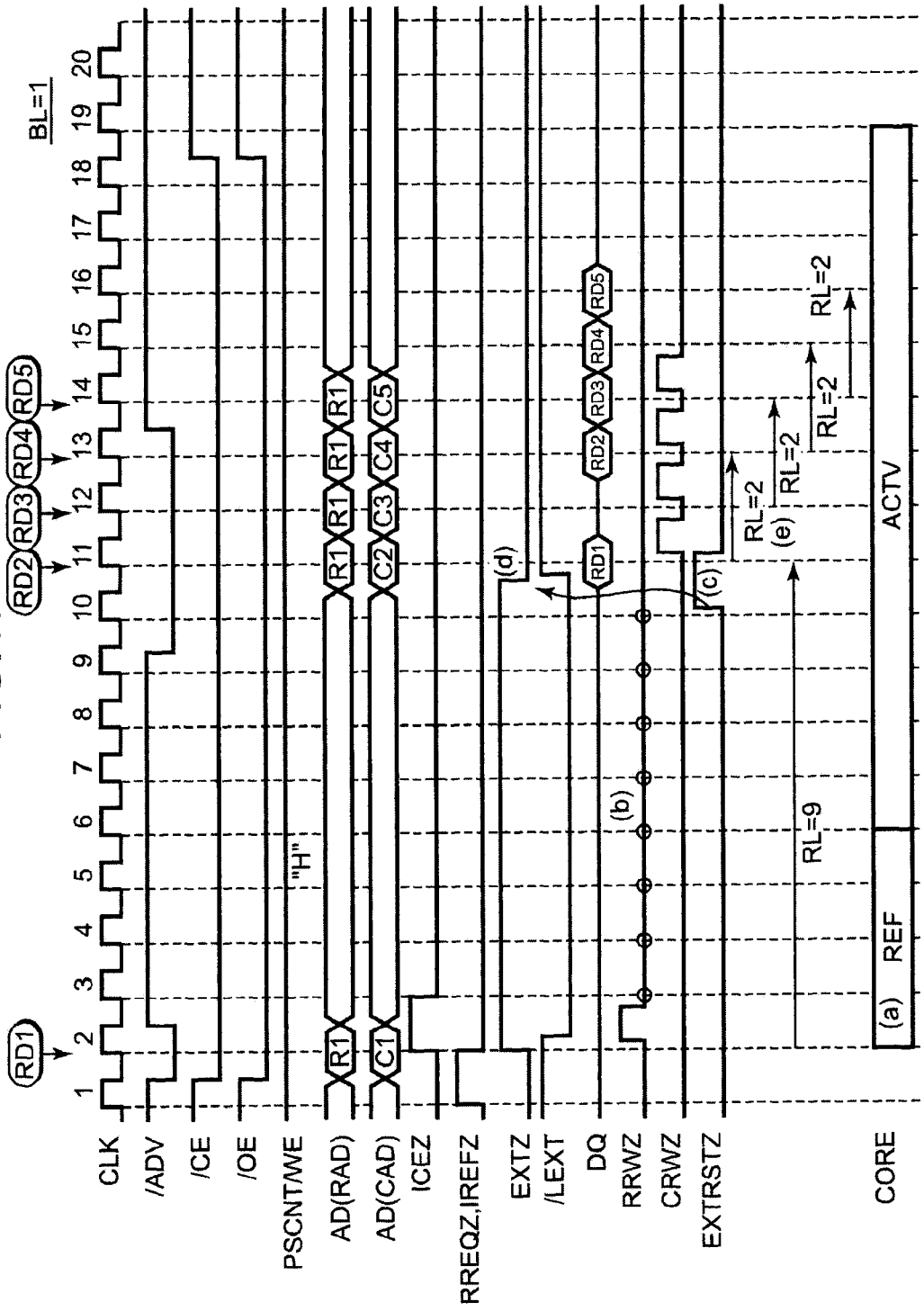
FIG. 17 shows an exemplary operation of a PSRAM.

FIG. 17 shows an exemplary operation of the PSRAM shown in FIG. 16. The operation until a fourth clock cycle is the same as the operation shown in FIG. 7. A refresh operation REF is performed before an access operation (FIG. 17(a)). A burst length BL is set to "1".

The reset control unit RSTCNT shown in FIG. 16 counts the number of clock cycles after receiving a row read-write signal RRWZ corresponding to a read command RD1 (FIG. 17(b)). The reset control unit RSTCNT temporarily activates the extension reset signal EXTRSTZ because a next read command or a next write command is not supplied in synchronization with a rising edge of a tenth clock signal CLK (FIG. 17(c)). The extension reset signal EXTRSTZ temporarily activated deactivates an extension signal EXTZ and a latency extension signal /LEXT is deactivated (FIG. 17(d)).

The deactivation of the latency extension signal /LEXT causes a read latency RL to be reduced to "2" from "9" (FIG. 17(e)). The operation without a refresh operation REF being inserted is the same as the operation shown in FIG. 8. The read latency RL of the first read command RD1 is "5" and the read latency RL of the second and the subsequent read commands RD2 to RD5 is "2".

Figure 18:
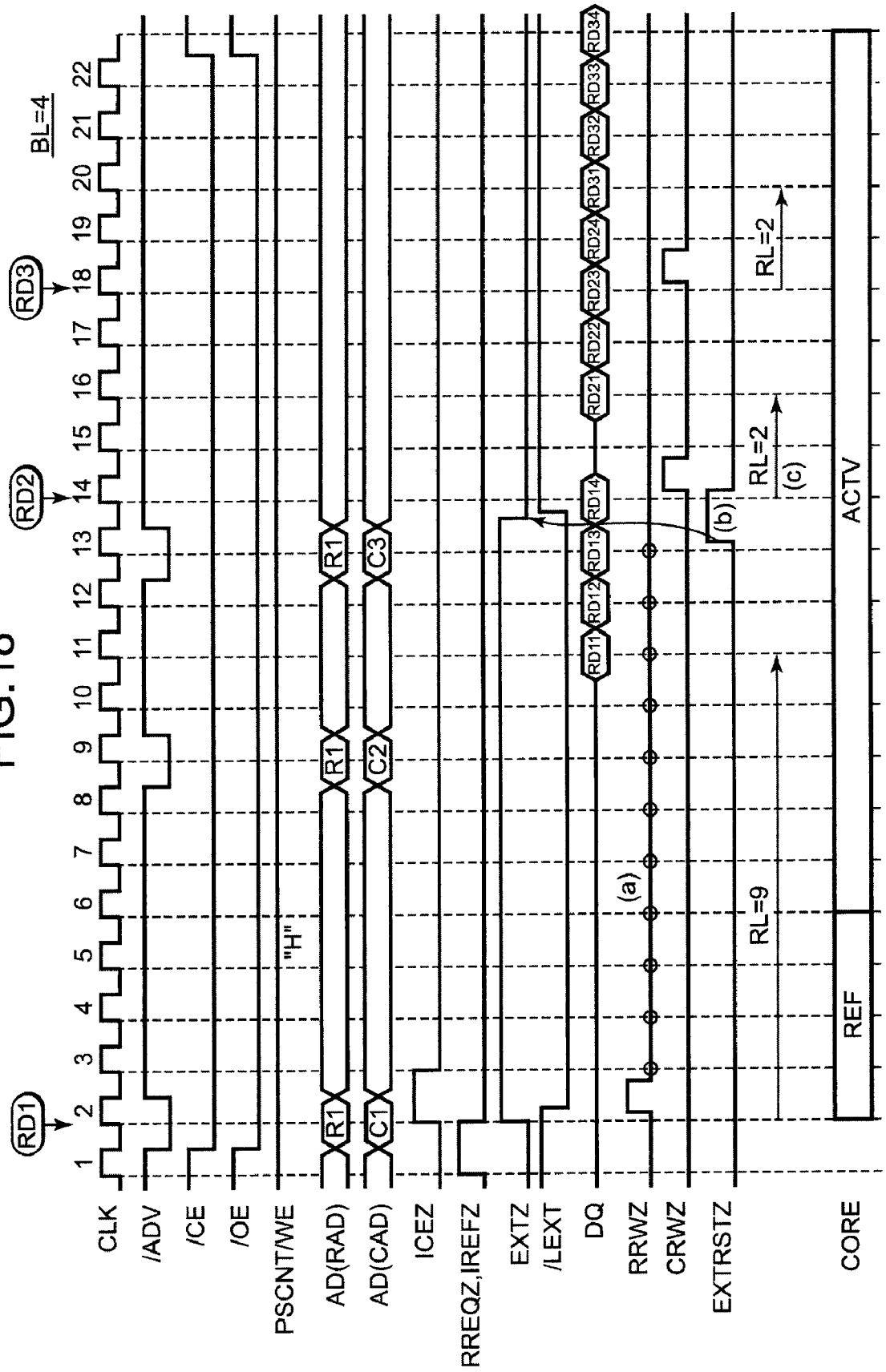
FIG. 18 shows another exemplary operation of the PSRAM.

FIG. 18 shows yet another exemplary operation of the PSRAM in FIG. 16.

In FIG. 18, the read commands RD1 to RD3 are sequentially supplied from the memory controller PSCNT and a page operation is performed. A burst length BL is set to "4". The refresh operation REF is inserted in the operation shown in FIG. 18, as well.

The reset control unit RSTCNT shown in FIG. 16 counts the number of clock cycles after receiving a row read-write signal RRWZ corresponding to the first read command RD1 (FIG. 18(a)). The reset control unit RSTCNT temporarily activates the extension reset signal EXTRSTZ because the next read command and the next write command is not supplied in synchronization with a rising edge of a thirteenth clock signal CLK (FIG. 18(b)). In the same manner as the operation shown in FIG. 13, the extension reset signal EXTRSTZ temporarily activated causes the read latency RL to be reduced (FIG. 18(c)).

The third embodiment has the same advantages as those in the first and the second embodiments. In the third embodiment, even if there are large number of clock cycles between the first access command (a row access command) supplied along with the chip enable signal /CE and the next access command (a column access command), a data transfer rate between the memory controller PSCNT and the PSRAM may be improved and an access efficiency of the PSRAM may be improved. In the operation shown in FIG. 17, the read latency RL of the read commands RD2 to RD5 is prevented from becoming "6".

Figure 19:
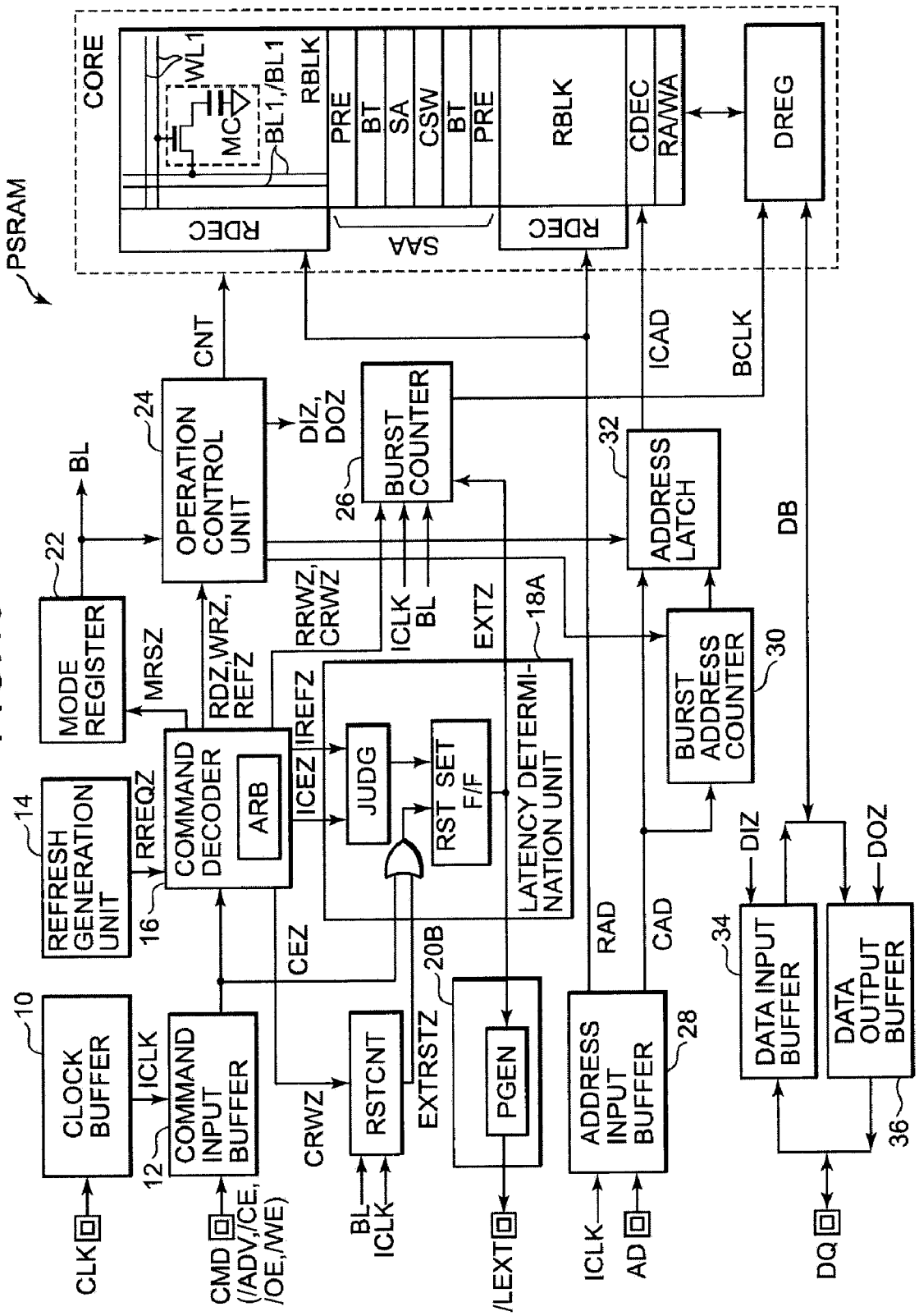
FIG. 19 shows a fourth embodiment.

FIG. 19 shows a fourth embodiment. In the fourth embodiment, the same numerical references as those shown in the first, the second, and the third embodiments are given to the same elements and disclosure thereof will be reduced or omitted. A semiconductor memory is, for example, a PSRAM. In the PSRAM, a latency output buffer 20B is different from the latency output buffer 20 in FIG. 12. The other structure shown in FIG. 19 is the same as that shown in FIG. 12.

The latency output buffer 20B includes a pulse generator PGEN generating a latency extension signal /LEXT (a pulse signal) having a negative pulse in synchronization with activation of an extension signal EXTZ. The latency extension signal /LEXT temporarily changes to a low level in synchronization with a rising edge of the extension signal EXTZ.

In the fourth embodiment, an operation of the PSRAM is the same as those in FIGS. 13 to 15 except a waveform of the latency extension signal /LEXT. As shown in FIG. 16, not only a column read-write signal CRWZ but also a row read-write signal RRWZ may be supplied to a reset control unit RSTCNT. Even if there are large number of clock cycles between a first access command supplied along with a chip enable signal /CE and a next access command, an access efficiency of the PSRAM is improved.

Figure 20:
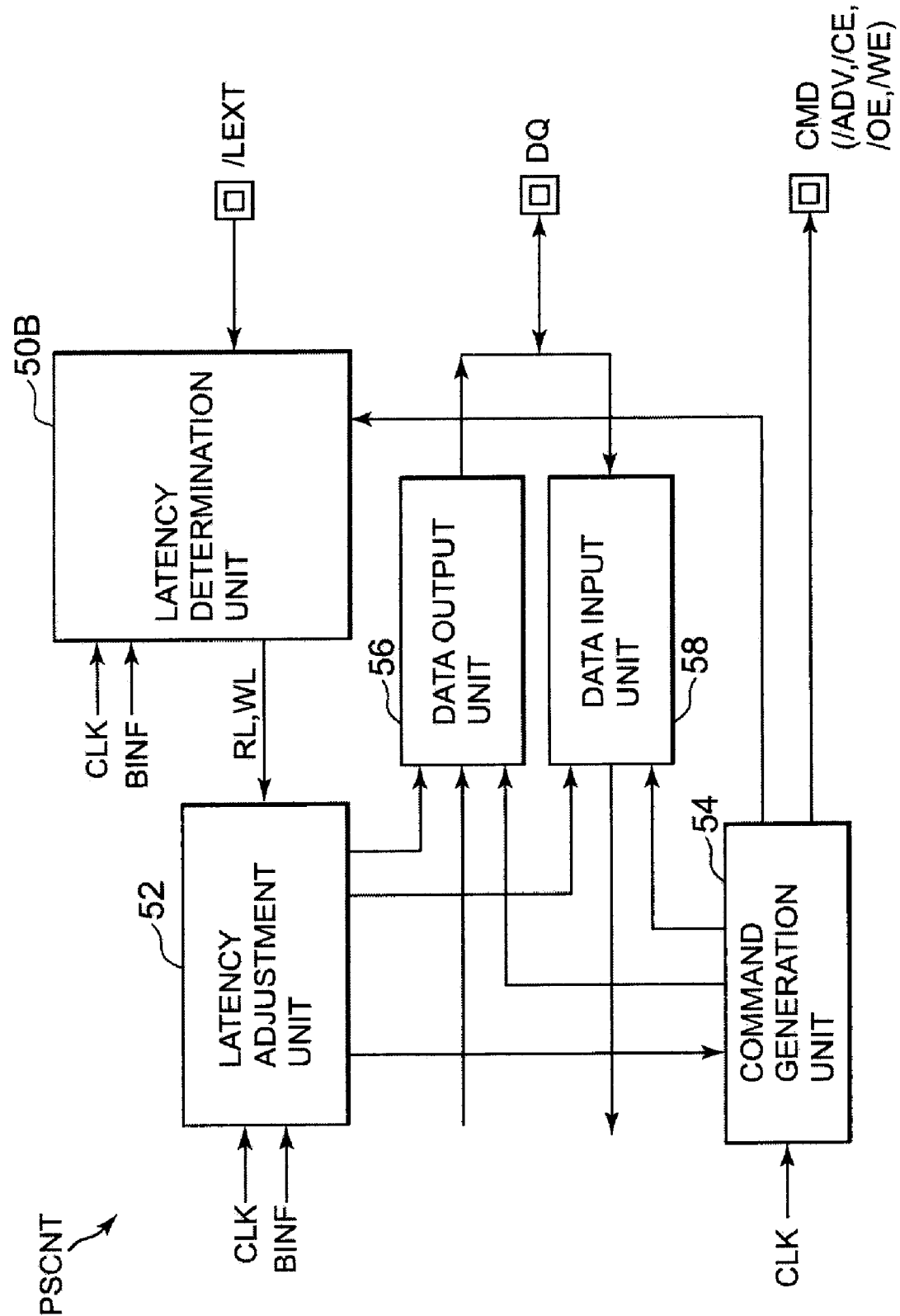
FIG. 20 shows an exemplary memory controller.

FIG. 20 shows an exemplary memory controller PSCNT shown in FIG. 4.

The memory controller PSCNT includes a latency determination unit 50B instead of the latency determination unit 50 in FIG. 5.

The latency determination unit 50B increases values of a read latency RL and a write latency WL in synchronization with a low pulse of the latency extension signal /LEXT. When a read command or a write command is not output from a command generation unit 54 during certain clock cycles obtained by adding 4 clocks to a value of burst information BINF indicating a burst length BL, the latency determination unit 50B reduces the values of the read latency RL and the write latency WL. The latency determination unit 50B detects that the read command or the write command is not generated for a certain period so as to reduce the read latency RL and the write latency WL.

Upon receipt of the low pulse of the latency extension signal /LEXT, the latency determination unit 50B and a latency adjustment unit 52 increase a system read latency RL between an output of a read access request and a receipt of read data and restores the system read latency RL when subsequent read access requests are not output for a certain period. Upon receipt of the low pulse of the latency extension signal /LEXT, the latency determination unit 50B and the latency adjustment unit 52 increase a system write latency WL between an output of a write access request and an output of the write data and restores the system write latency WL if subsequent write access requests are not output for a certain period.

Figure 21:
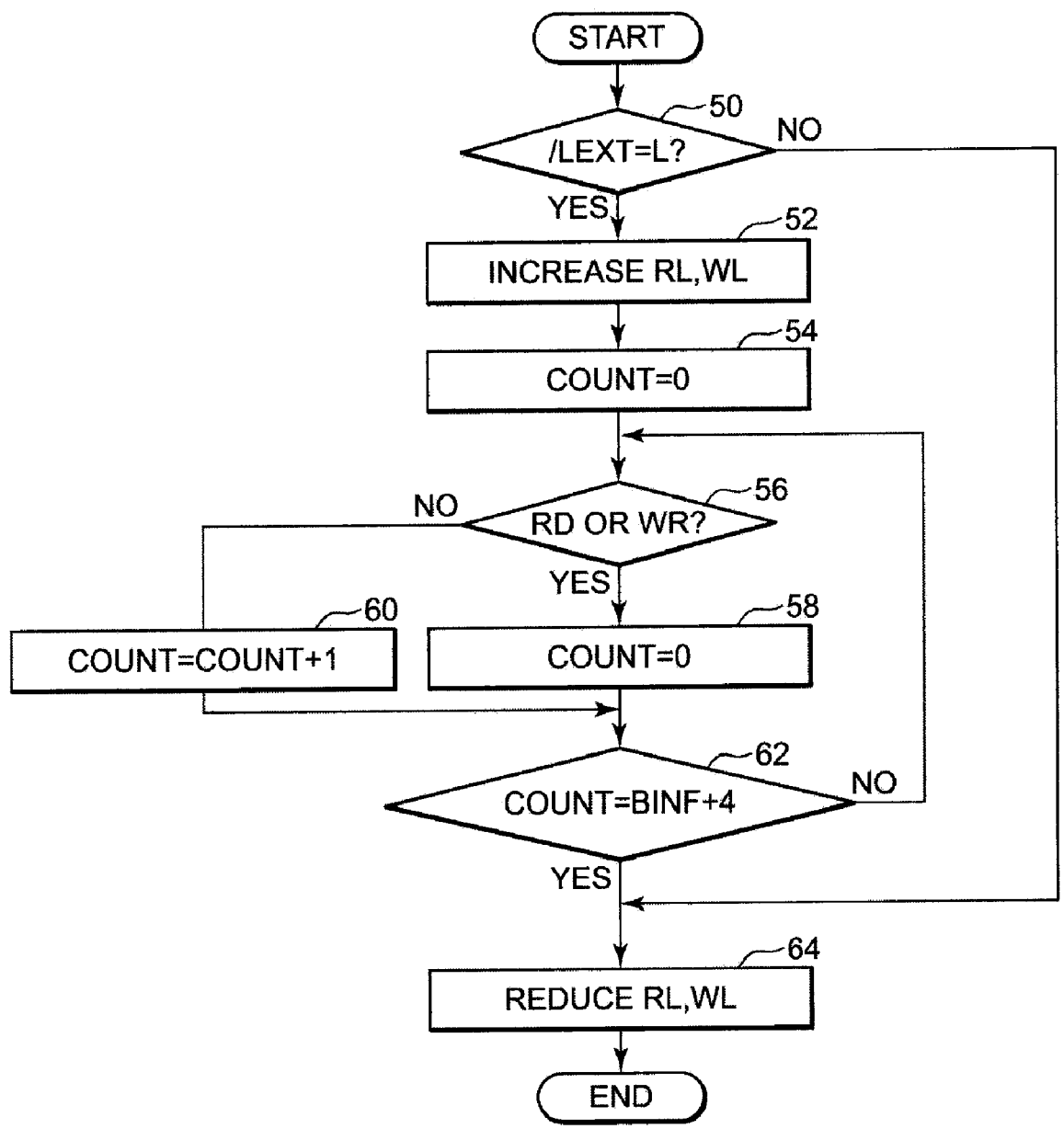
FIG. 21 shows an exemplary operation of a latency determination unit.

FIG. 21 shows an exemplary operation of the latency determination unit 50B shown in FIG. 20. In operation 50, the latency determination unit 50B detects whether or not the latency extension signal /LEXT from the PSRAM is changed to a low level. If the latency extension signal /LEXT is at the low level, a process proceeds to operation 52. If the latency extension signal /LEXT is at a high level, the process proceeds to operation 64.

In operation 52, the latency determination unit 50B increases the values of the read latency RL and the write latency WL and informs the latency adjustment unit 52 of it. The latency adjustment unit 52 controls the command generation unit 54, a data output unit 56, and a data input unit 58, based on the read latency RL and the write latency WL increased. In operation 54, the latency determination unit 50B resets a counter value of a counter incorporated therein to "0".

In operation 56, the latency determination unit SOB detects, based on command information from the command generation unit 54, whether or not the read command RD or the write command WR is output to the PSRAM. When the command RD or the command WR is output, a counter value COUNT is reset to "0" in operation 58. When the command RD or the command WR is not output, the counter value COUNT is increased by "1" in synchronization with a clock signal CLK in operation 60.

In operation 62, the latency determination unit 50B determines whether or not the counter value COUNT is equal to a value (a switch value) obtained by adding 4 clock cycles to the value of the burst information BINF. When the counter value COUNT does not reach the switch value, the process proceeds to operation 56. The read latency RL and the write latency WL remain increased.

When the counter value COUNT reaches the switch value, the process proceeds to operation 64. The latency determination unit SOB determines that the command RD or the command WR has not been generated in certain clock cycles.

In operation 64, the latency determination unit 50B reduces the values of the read latency RL and the write latency WL and informs the latency adjustment unit 52 of it. The latency adjustment unit 52 controls the command generation unit 54, the data output unit 56, and the data input unit 58 based on the read latency RL and the write latency WL thus reduced.

Figure 22:
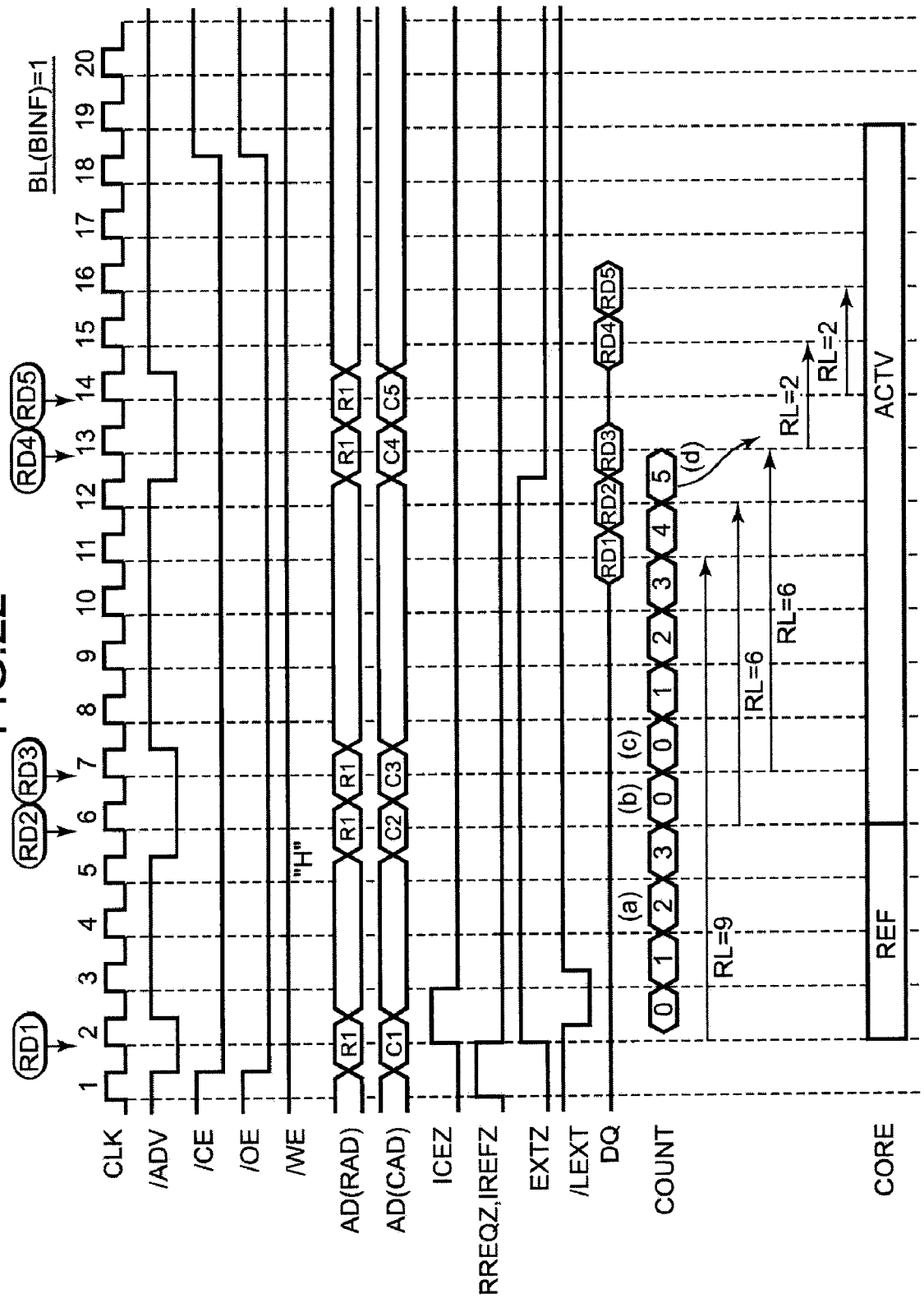
FIG. 22 shows an exemplary operation of a PSRAM.

FIG. 22 shows an exemplary operation of the PSRAM shown in FIG. 19.

The operation of the PSRAM shown in FIG. 22 is the same as that shown in FIG. 13 except a waveform of the latency extension signal /LEXT. The burst length BL is set to "1".

The latency determination unit 50B shown in FIG. 20 determines whether or not the next command RD or WR is output on a clock cycle basis after the read command RD has been output. When the command RD or WR is not output, the latency determination unit 50B sequentially increases the counter value COUNT (FIG. 22(a)). When the command RD or WR is output, the latency determination unit 50B resets the counter value COUNT to "0" (FIG. 22(b), (c)). When the counter value COUNT becomes "5", the latency determination unit 50B reduces the read latency RL and the write latency WL (FIG. 22(d)).

Figure 23:
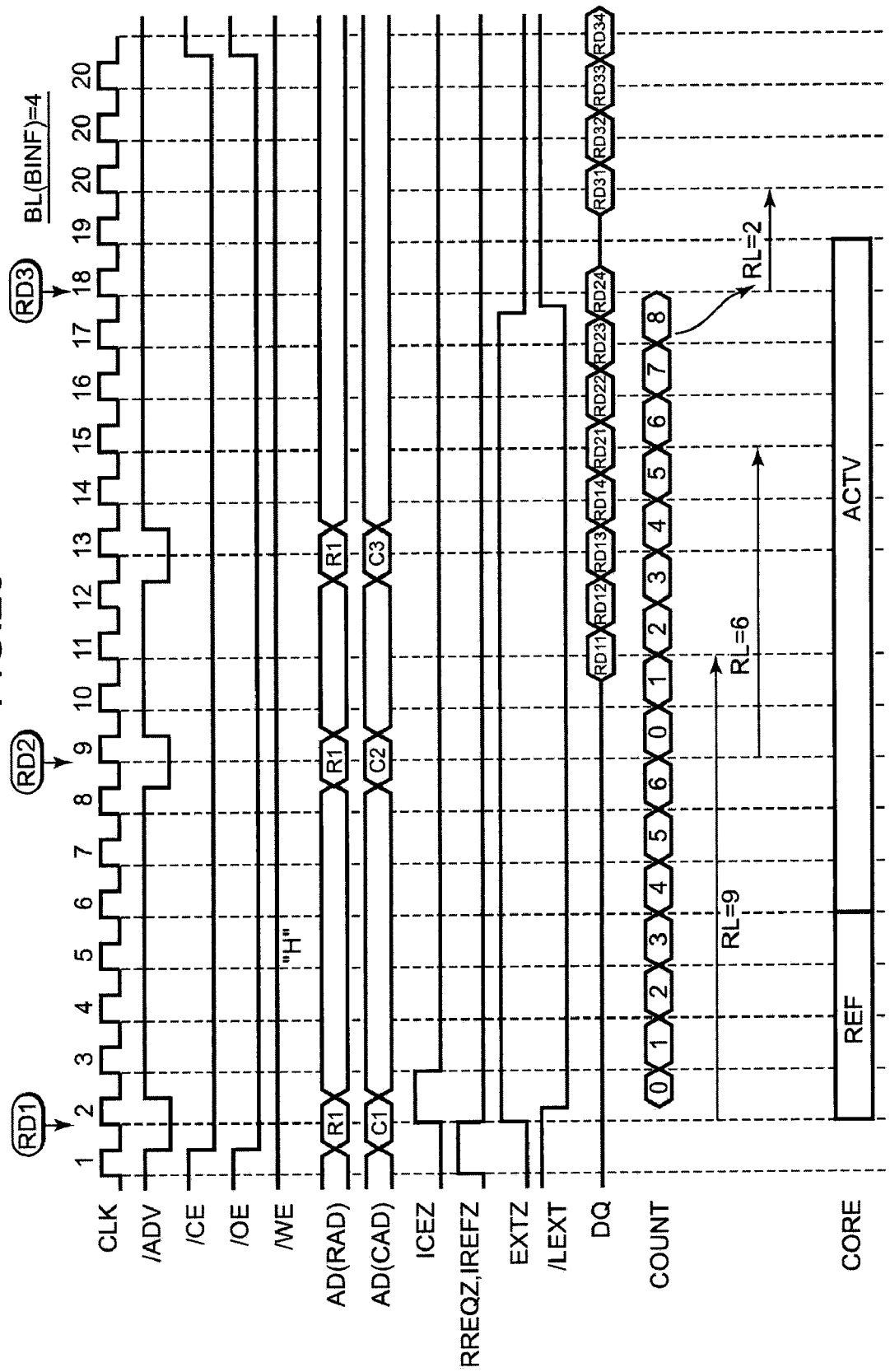
FIG. 23 shows yet another exemplary operation of the PSRAM.

FIG. 23 shows another exemplary operation of the PSRAM shown in FIG. 19. The operation of the PSRAM shown in FIG. 23 is the same as that shown in FIG. 13 except a waveform of the latency extension signal /LEXT. The burst length BL is set to "4". When the counter value COUNT becomes "8", the latency determination unit 50B reduces the read latency RL and the write latency WL.

The fourth embodiment has the same advantages as those in the second and the third embodiments. In the fourth embodiment, the memory controller PSCNT may monitor levels of the latency extension signal /LEXT in a clock cycle subsequent to the clock cycle at which the chip enable signal /CE is supplied to the PSRAM. Consequently, the operation that changes the read latency RL and the write latency WL is promptly performed in the memory controller PSCNT.

The latency determination unit 50B (FIG. 20) of the memory controller PSCNT determines whether or not the read latency RL and the write latency WL may be reduced by monitoring the read command RD or the write command WR output to the PSRAM. In comparison with the operation which is performed in response to the latency extension signal /LEXT from the PSRAM, the fourth embodiment may promptly reduce the read latency RL and the write latency WL.

For example, the memory controller PSCNT determines the output of a read command RD1 in synchronization with a rising edge of a first clock signal CLK and outputs the read command RD1 to the PSRAM in synchronization with a falling edge of the first clock signal CLK. The latency determination unit 50B shown in FIG. 20 may determine whether or not the commands RD and WR are output one (1) clock cycle earlier than in the second embodiment in FIG. 12 and the third embodiment in FIG. 16. In consequence, an operation margin of the memory controller PSCNT becomes larger in the fourth embodiment. In the fourth embodiment, even if the clock signal CLK has a high frequency, the switch operations of the read latency RL and the write latency WL are reliably performed, thereby preventing a malfunction of the PSRAM.

Figure 24:
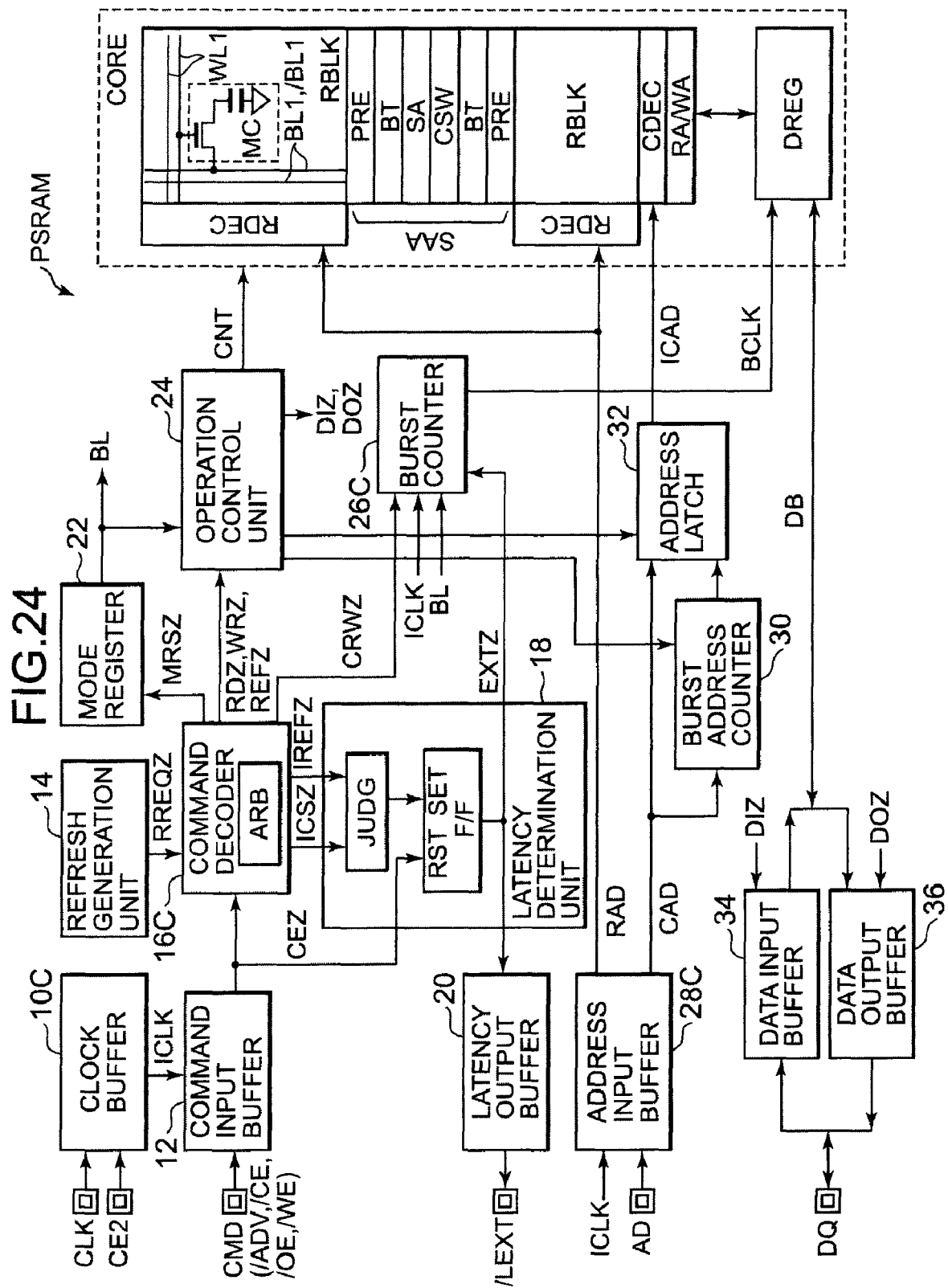
FIG. 24 shows a fifth embodiment.

FIG. 24 shows a fifth embodiment. In the fifth embodiment, the same numerical references as those shown in the first to the fourth embodiments are given to the same elements and disclosure thereof will be reduced or omitted.

A semiconductor memory is, for example, a PSRAM having an SDRAM type input-output interface. The PSRAM in the fifth embodiment includes a clock buffer 10C, a command decoder 16C, a burst counter 26C, and a address input buffer 28C instead of the clock buffer 10, the command decoder 16, the burst counter 26, and the address input buffer 28, in FIG. 1. The other structure is the same as that shown in FIG. 1.

The clock input buffer 10C receives a clock signal CLK when a chip enable signal CE2 is at a high level and outputs an internal clock signal ICLK. The clock input buffer 10C stops outputting the internal clock signal ICLK when the chip enable signal CE2 is at a low-level. The PSRAM causes operations of internal circuits and a refresh operation to stop when the output of the internal clock signal ICLK is stopped and the PSRAM enters into a power down mode (a low power consumption mode) from a normal operation mode.

A command decoder 16C outputs only a column read-write signal CRWZ to a burst counter 26C. In the fifth embodiment, not a read command RD or a write command WR, but an active command ACT is supplied to the PSRAM along with a chip enable signal /CE. A row read-write signal RRWZ is not generated. Upon receipt of the column read-write signal CRWZ, the burst counter 26C outputs a burst clock signal BCLK having pulses, the number of which corresponds to a burst length BL, in synchronization with the internal clock signal ICLK.

The address input buffer 28C receives a row address signal RAD and a column address signal CAD supplied to a common address terminal AD at different timing, respectively. The PSRAM in the fifth embodiment is an address multiplex type.

Figure 25:
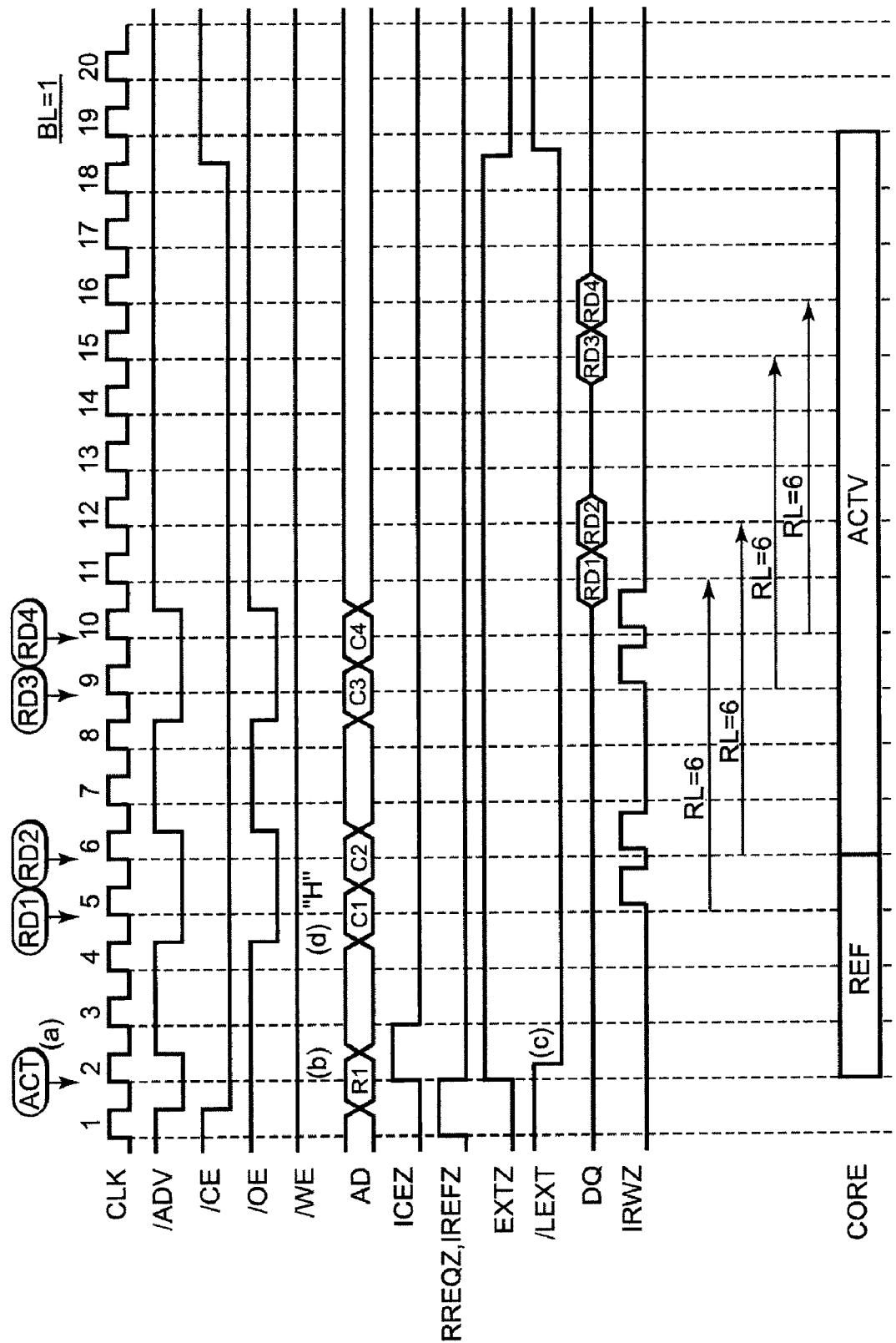
FIG. 25 shows an exemplary operation of the PSRAM.

FIG. 25 shows an exemplary operation of the PSRAM shown in FIG. 24. The command decoder 16C detects the active command ACT based on a falling edge of the chip enable signal /CE (FIG. 25(*a*)). A row address signal R1 is supplied to an address terminal AD (FIG. 25(*b*)). In the same manner as shown in FIG. 7, since a refresh operation REF is inserted immediately before activation of the chip enable signal /CE, the latency extension signal /LEXT is activated (FIG. 25(*c*)). The PSRAM activates word line WL1 indicated by a row address signal RAD in response to the active command ACT and activates a sense amplifier SA.

A read command RD1 and a column address signal C1 are supplied to the PSRAM in synchronization with a rising edge of a fifth clock signal CLK (FIG. 25(*d*)). Since read data or write data is not transferred to a data terminal DQ in response to the active command ACT, the read command R1 is supplied one (1) clock cycle earlier than a read command RD2 shown in FIG. 7. The operation accompanied by the read commands RD1 to RD4 is the same as that shown in FIG. 7, except that the read command R1 is supplied one (1) clock cycle earlier.

Figure 26:
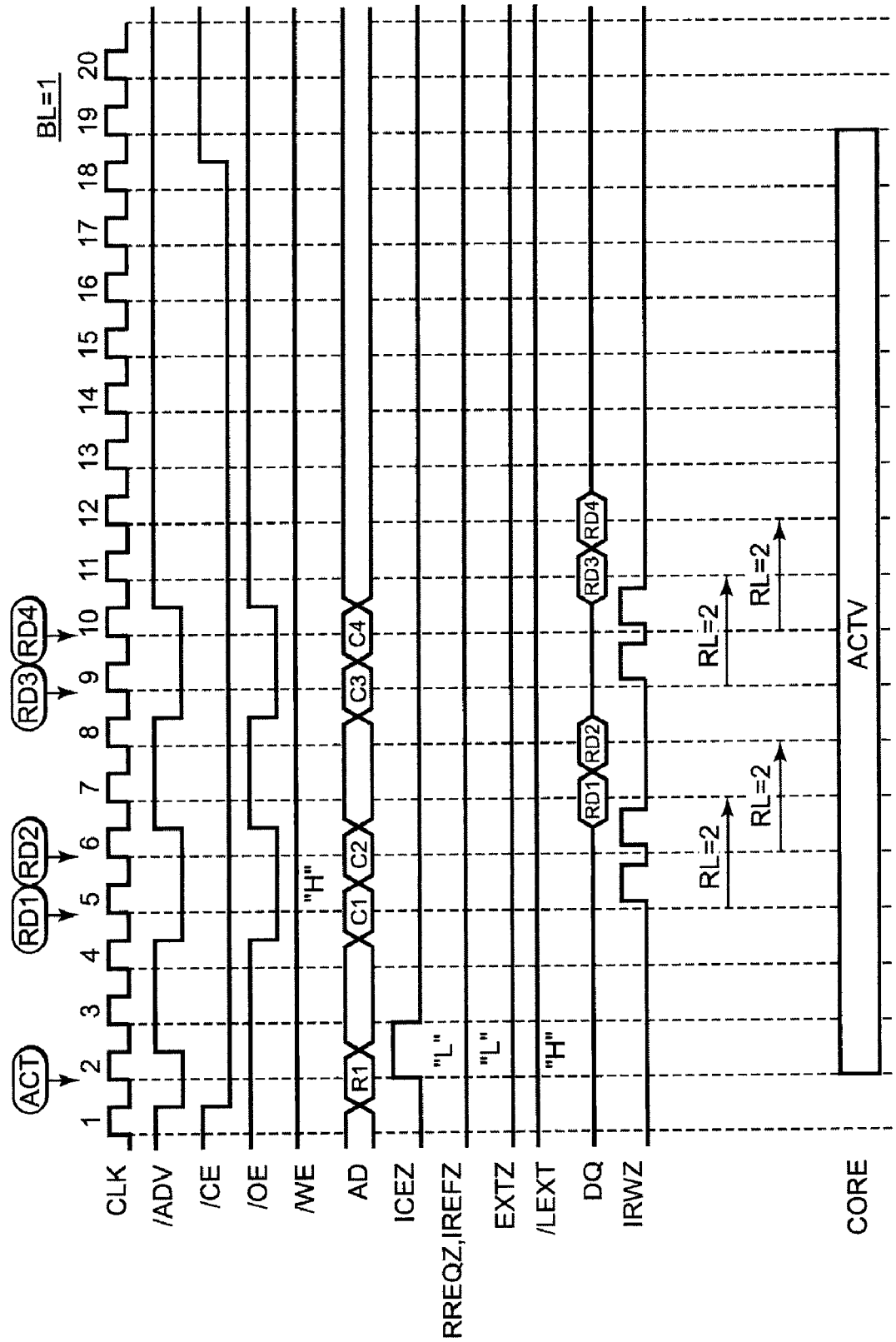
FIG. 26 shows yet another exemplary operation of the PSRAM.

FIG. 26 shows another exemplary operation of the PSRAM shown in FIG. 24. In the operation of the PSRAM shown in FIG. 26, the active command ACT is supplied instead of the read command RD1 shown in FIG. 8. The refresh operation REF is not inserted. In the same manner as the operation shown in FIG. 25, the read commands RD1 to RD4 are supplied to the PSRAM one (1) clock cycle earlier than the read commands RD2 to RD5 shown in FIG. 8 and the read data is output one (1) clock cycle earlier. The other operation is the same as that shown in FIG. 8.

The fifth embodiment has the same advantages as those in the first to fourth embodiments. The PSRAM having the SDRAM type input-output interface as shown in the fifth embodiment may prevent a malfunction of the PSRAM.

Figure 27:
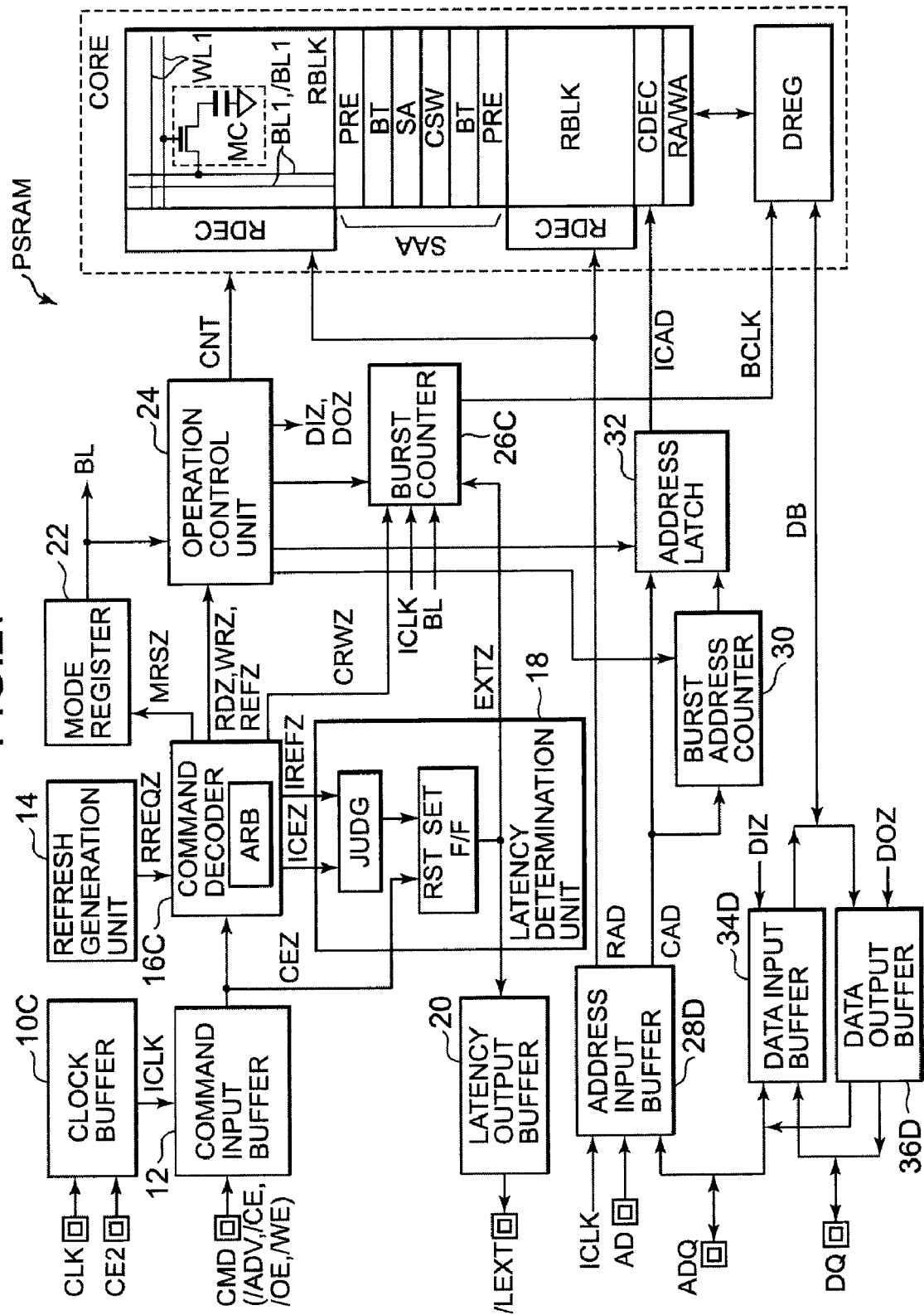
FIG. 27 shows a sixth embodiment.

FIG. 27 shows a sixth embodiment. In the sixth embodiment, the same numerical references as those shown in the first to fifth embodiments are given to the same elements and disclosure thereof will be reduced or omitted. A semiconductor memory is, for example, a PSRAM having an SDRAM type input-output interface. The PSRAM includes an address data terminal ADQ receiving an address signal and a data signal.

An address input buffer 28D outputs an address signal supplied to an address terminal AD and the address data terminal ADQ, as a row address signal RAD. A data input buffer 34D outputs write data supplied to a data terminal DQ and the address data terminal ADQ to a data bus DB. A data output buffer 36D outputs read data supplied from a memory core CORE to the data bus DB, to the data terminal DQ and the address data terminal ADQ. The other structure shown in FIG. 27 is the same as that shown in FIG. 24.

Figure 28:
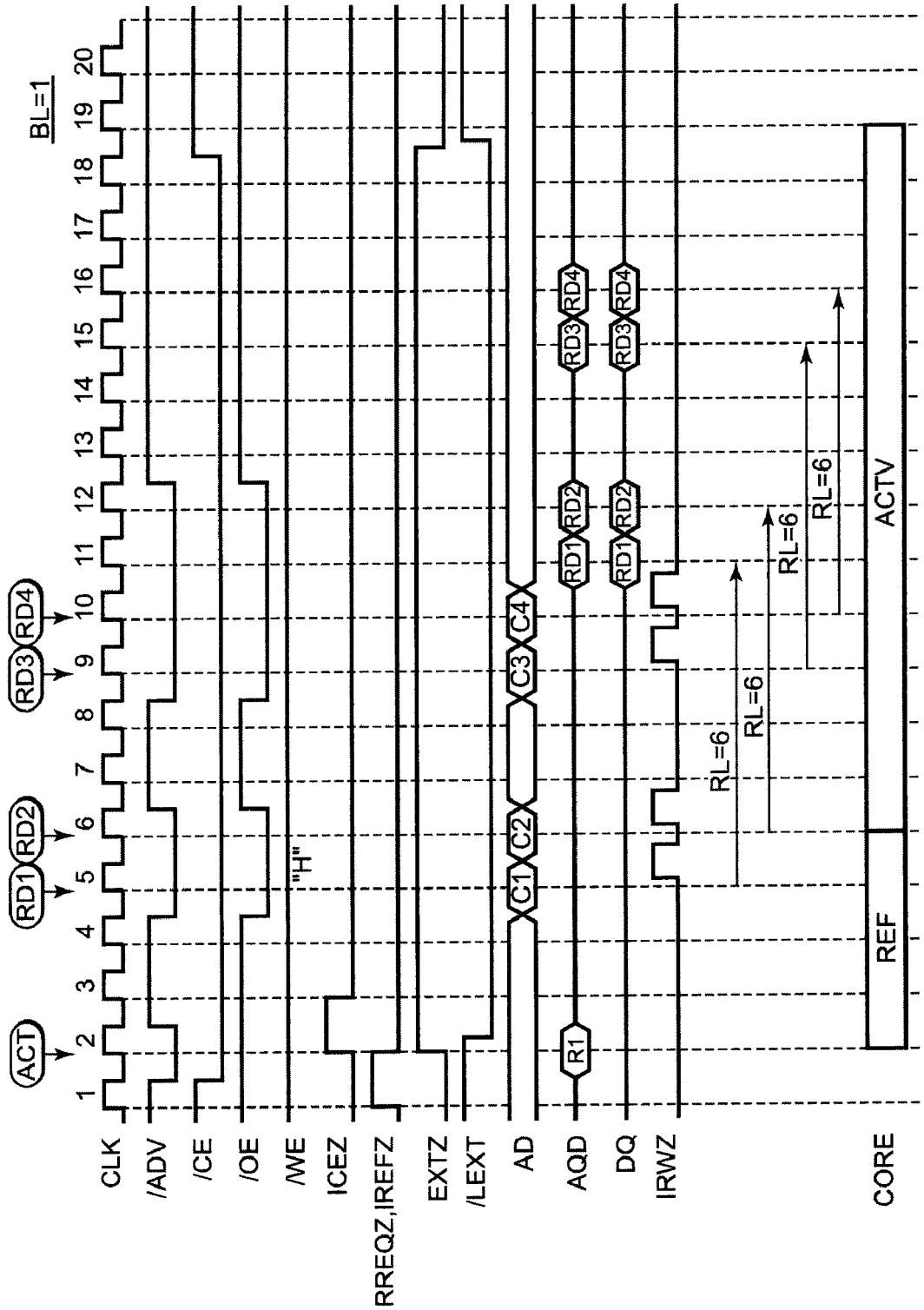
FIG. 28 shows an exemplary operation of a PSRAM.

FIG. 28 shows an exemplary operation of the PSRAM shown in FIG. 27. The operation is the same as that shown in FIG. 25 except that the row address signal RAD is supplied to the address data terminal ADQ and read data RD1 to RD4 is output not only to the data terminal DQ but also to the address data terminal ADQ.

Figure 29:
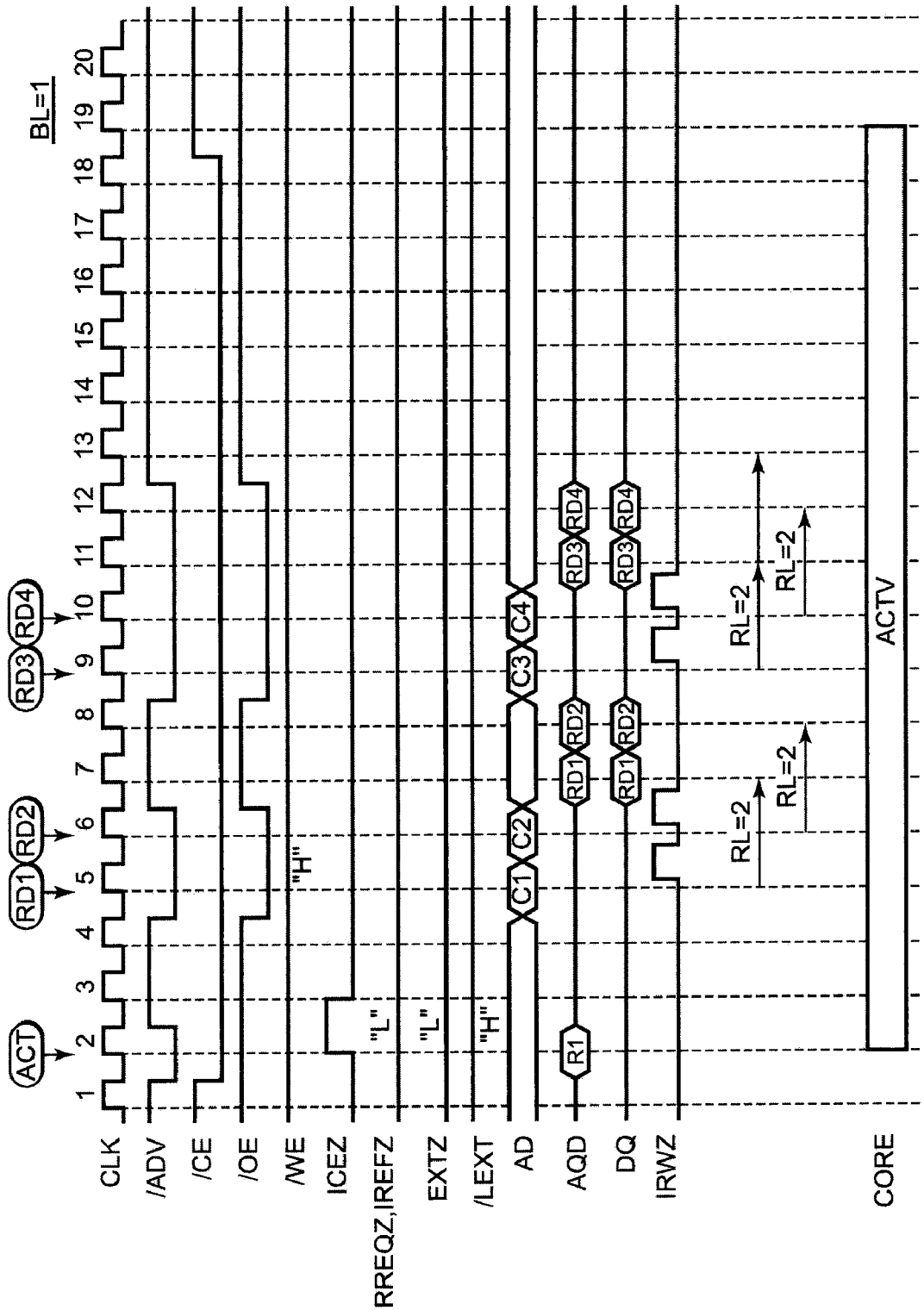
FIG. 29 shows another exemplary operation of the PSRAM.

FIG. 29 shows another exemplary operation of the PSRAM shown in FIG. 27. The operation is the same as that shown in FIG. 26 except that the row address signal RAD is supplied to the address data terminal ADQ and the read data RD1 to RD4 is output not only to the data terminal DQ but also to the address data terminal ADQ.

The sixth embodiment has the same advantages as those in the first to the fifth embodiments. The PSRAM having the SDRAM type input-output interface and the address data terminal ADQ as shown in the sixth embodiment may prevent a malfunction of the PSRAM.

Figure 30:
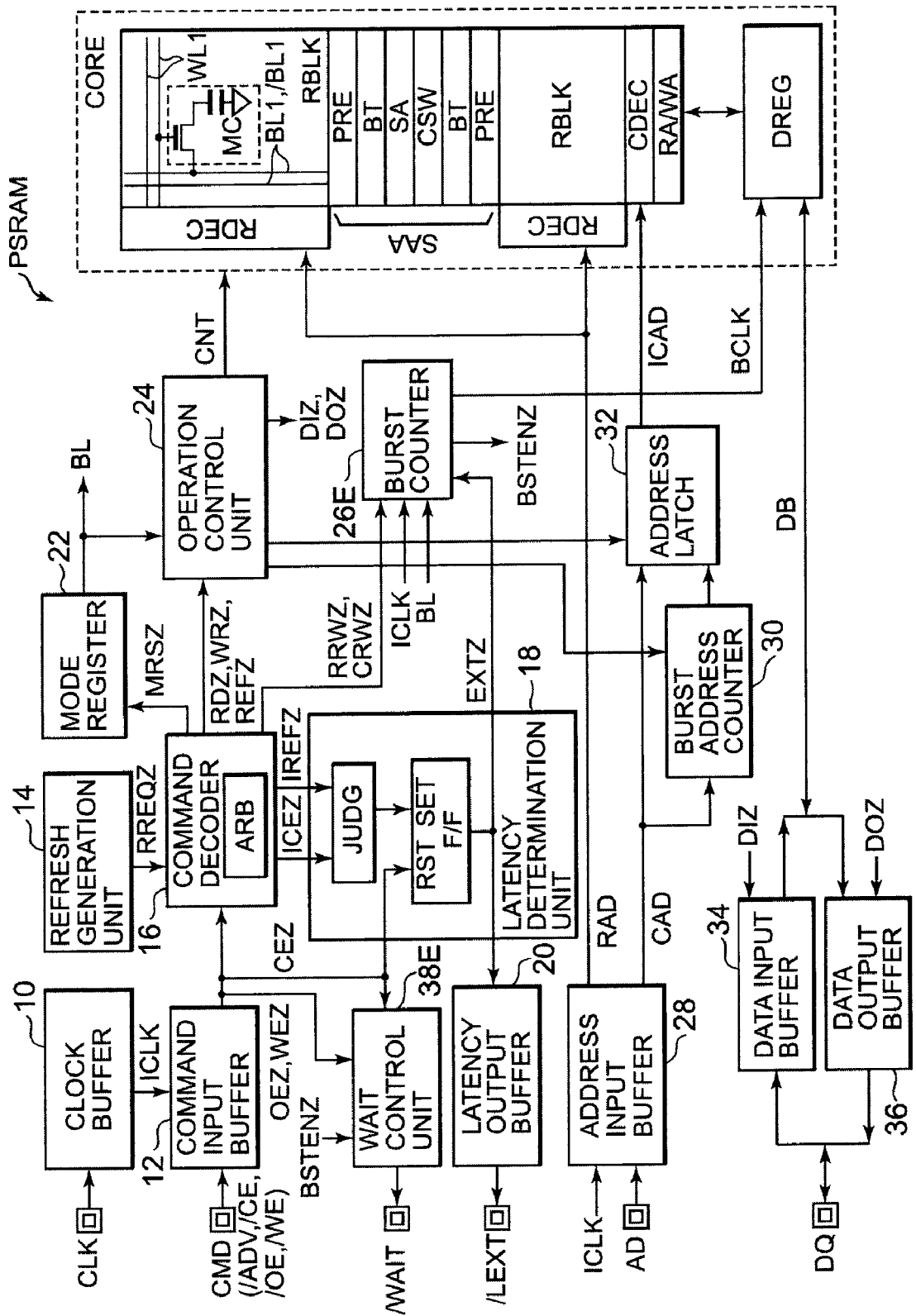
FIG. 30 shows a seventh embodiment.

FIG. 30 shows a seventh embodiment. In the seventh embodiment, the same numerical references as those shown in the first to the sixth embodiments are given to the same elements and disclosure thereof will be reduced or omitted.

A semiconductor memory is, for example, a PSRAM. The PSRAM includes a wait control unit 38E that outputs a wait signal indicating timing of outputting read data and a wait terminal /WAIT. The PSRAM includes a burst counter 26E instead of the burst counter 26 in FIG. 1. The other structure of the PSRAM in FIG. 30 is the same as that shown in FIG. 1.

The bust counter 26E has a function of outputting a burst enable signal BSTENZ in addition to the function of the burst counter 26 in FIG. 1. The wait control unit 38E sets the wait signal /WAIT to a high level or to a low level or to a high impedance state in response to a chip enable signal CEZ, an output enable signal OEZ, a write enable signal WEZ, and a burst enable signal BSTENZ.

Figure 31:
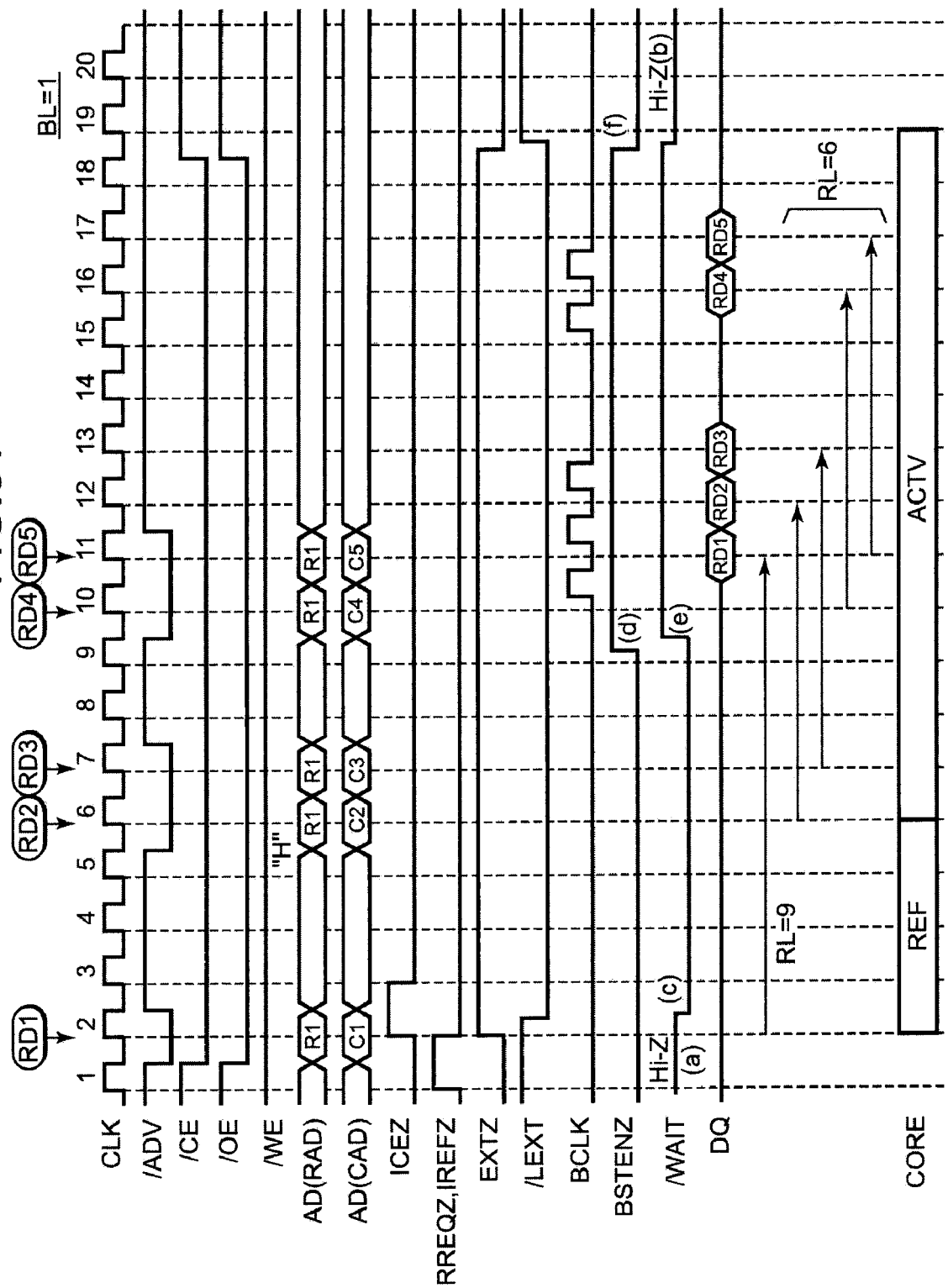
FIG. 31 shows an exemplary operation of the PSRAM.

FIG. 31 shows an exemplary operation of the PSRAM shown in FIG. 30. The operation shown in FIG. 31 is the same as that shown in FIG. 7 except waveforms of the burst enable signal BSTENZ and the wait signal /WAIT. The wait control unit 38E sets the wait signal /WAIT to the high impedance state Hi-Z during deactivation of the chip enable signal /CE (FIG. 31(*a*), (*b*)). The wait control unit 38E activates the wait signal /WAIT to the low level when a first command is a read command RD1 (FIG. 31(*c*)). The burst counter 26E activates the burst enable signal BSTENZ one (1) clock cycle before the burst clock signal BCLK is output in response to a first read command RD (FIG. 31(*d*)).

The wait control unit 38E deactivates the wait signal /WIAT to the high level in synchronization with the activation of the burst enable signal BSTENZ (FIG. 31(*e*)). The wait signal /WIAT is activated in response to the first read command RD and is deactivated before the read data corresponding to a first read request RD is output. A memory controller PSCNT detects the high level of the wait signal /WAIT in synchronization with a rising edge of a tenth clock signal CLK and detects that a first read data RD1 is output from the PSRAM in synchronization with the next clock signal CLK. The burst counter 26E deactivates the burst enable signal BSTENZ in synchronization with the deactivation of the chip enable signal /CE (FIG. 31(*f*)).

Figure 32:
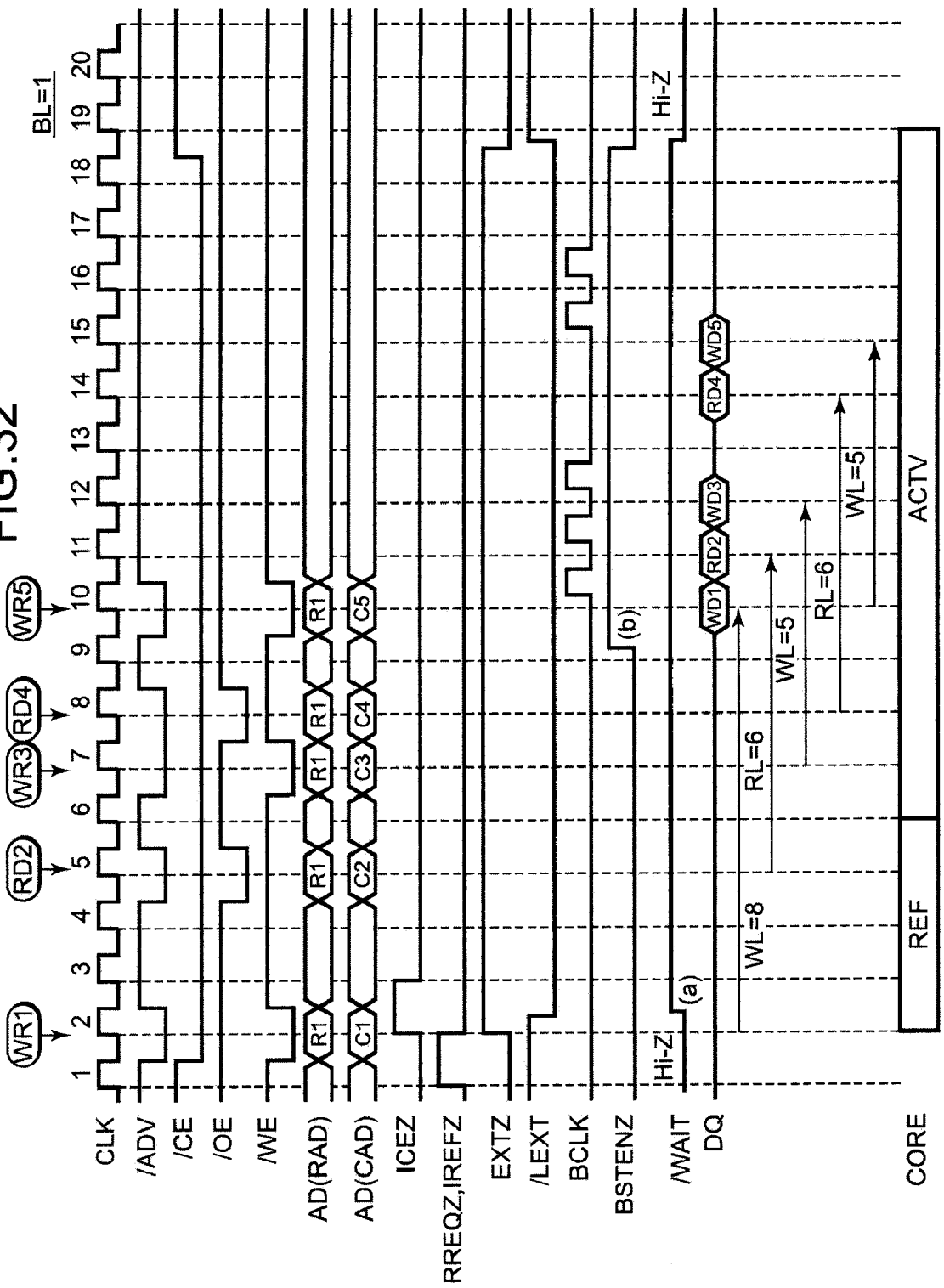
FIG. 32 shows another exemplary operation of the PSRAM.

FIG. 32 shows another exemplary operation of the PSRAM shown in FIG. 30. The operation shown in FIG. 32 is the same as that shown in FIG. 9 except waveforms of the burst enable signal BSTEN and the wait signal /WAIT.

The wait control unit 38E deactivates the wait signal /WAIT to the high level in synchronization with a write command WR1 (FIG. 32(*a*)). In the same manner as shown in FIG. 31, the burst counter 26E activates the burst enable signal BSTENZ one (1) clock cycle before the burst clock signal BCLK is output in response to the first read command RD or the write command WR (FIG. 32(*b*)).

The seventh embodiment has the same advantages as those in the first to the sixth embodiments. The PSRAM having the function of outputting the wait signal /WAIT that indicates the timing of outputting the read data shown in the seventh embodiment may prevent a malfunction of the PSRAM.

A pseudo-SRAM having the SDRAM type input-output interface is used in the embodiments shown in FIGS. 24 to 27. The pseudo SRAM having the SDRAM type input-output interface may be used in the other embodiments as well. A pseudo-SRAM having the address data terminal ADQ is used in the embodiment shown in FIG. 27. The pseudo SRAM having the address data terminal ADQ may be used in the other embodiments. A pseudo SRAM having a wait terminal /WAIT is used in the embodiment shown in FIG. 30. The pseudo SRAM having the wait terminal /WAIT may be used in the other embodiments.

Exemplary embodiments of the present invention have now been described in accordance with the above advantages. It will be appreciated that these examples are merely illustrative of the invention. Many variations and modifications will be apparent to those skilled in the art.

The invention claimed is:

1. A semiconductor memory comprising:
   a memory core that includes a plurality of memory cells;
   a refresh generation unit that generates a refresh request for refreshing the memory cell;
   a core control unit that performs an access operation in response to an access request;
   a latency determination unit that activates a latency extension signal upon a conflict between activation of a chip enable signal and the refresh request and deactivates the latency extension signal in response to deactivation of the chip enable signal;
   a latency output buffer that outputs the latency extension signal; and
   a data control unit that changes a latency from the access request to a transfer of data to a data terminal during the activation of the latency extension signal.

2. The semiconductor memory according to claim 1, wherein the data control unit increases the latency in comparison with a latency during the deactivation of the latency extension signal.

3. The semiconductor memory according to claim 1, wherein the core control unit performs the access operation in response to a first access request supplied along with the activation of the chip enable signal and a subsequent access request supplied during the activation of the chip enable signal, and further includes a latency control unit that outputs an extension reset signal when the subsequent access request is not supplied for a certain period.

4. The semiconductor memory according to claim 1, wherein the latency includes at least one of a read latency in which read data is transferred to the data terminal based on a read request and a write latency in which write data is transferred to the data terminal based on a write request.

5. The semiconductor memory according to claim 3, further comprising:
   a mode register which sets a burst length indicating a number of times data inputted or outputted in response to the access request,
   wherein the certain period is obtained by adding a clock cycle indicated by the burst length to a certain number of clock cycles.

6. The semiconductor memory according to claim 1, wherein the latency output buffer outputs as the latency extension signal a pulse signal synchronized with the activation of the latency extension signal.

7. The semiconductor memory according to claim 1, wherein the data control unit includes:
   a burst counter that counts, in response to the access request, and outputs a burst clock signal upon a counter value reaching an expected value,
   wherein the expected value is increased upon the activation of the latency extension signal.

8. The semiconductor memory according to claim 7, further comprising:
   a data register that transfers at least one of read data and write data in synchronization with the burst clock signal.

9. The semiconductor memory according to claim 1, wherein
   the core control unit performs the access operation in response to a first access request supplied along with the activation of the chip enable signal and a subsequent access request supplied during the activation of the chip enable signal, and
   the data control unit sets a difference between a latency corresponding to the first access request and a latency corresponding to the subsequent access request during the activation of the latency extension signal equal to a difference between a latency corresponding to the first access request and a latency corresponding to the subsequent access request during the deactivation of the latency extension signal.

10. The semiconductor memory according to claim 8, wherein the latency includes at least one of a read latency in which the read data is transferred to the data terminal based on a read request and a write latency in which the write data is transferred to the data terminal based on a write request.

11. The semiconductor memory according to claim 1, further comprising:
    a wait control unit that outputs a wait signal, which is activated in response to the access request and is deactivated before data corresponding to the access request is output.

12. The semiconductor memory according to claim 1, wherein the core control circuit performs the access operation after a refresh operation upon the conflict between the activation of the chip enable signal and the refresh request.

13. A memory system comprising:
    a semiconductor memory; and
    a memory controller that supplies the semiconductor memory with an access request for accessing the semiconductor memory,
    wherein the semiconductor memory includes:
    a memory core that includes a plurality of memory cells;
    a refresh generation unit that generates a refresh request for refreshing the memory cell;
    a core control unit that performs an access operation in response to the access request;
    a latency determination unit that activates a latency extension signal upon a conflict between activation of a chip enable signal and the refresh request and deactivates the latency extension signal in response to deactivation of the chip enable signal;
    a latency output buffer that outputs the latency extension signal to an outside; and
    a data control unit that changes a latency between the access request and transfer of data to the data terminal during the activation of the latency extension signal.

14. The memory system according to claim 13, wherein the memory controller includes:
    a system latency control unit that changes a system latency between output of the access request and the transfer of the data to the data terminal of the memory controller based on the latency extension signal output from the semiconductor memory.

15. The memory system according to claim 14, wherein the system latency control unit increases the system latency in comparison with a system latency during the deactivation of the latency extension signal.

16. The memory system according to claim 13, wherein the latency includes at least one of a read latency in which read data is transferred to the data terminal based on a read request and a write latency in which write data is transferred to the data terminal based on a write request.

17. The memory system according to claim 14, wherein the core control unit performs the access operation in response to a first access request supplied along with the activation of the chip enable signal and a subsequent access request supplied during the activation of the chip enable signal, and
wherein the system latency control unit restores the changed system latency when the subsequent access request is not supplied for a certain period.

18. A memory access control method comprising:
performing an access operation on a plurality of memory cells in response to a first access request supplied along with activation of a chip enable signal and a subsequent access request supplied during the activation of the chip enable signal;
refreshing the plurality of memory cells in response to a refresh request;
activating a latency extension signal upon a conflict between the activation of the chip enable signal and the refresh request and deactivating the latency extension signal in response to deactivation of the chip enable signal;
outputting the latency extension signal; and
increasing a latency between the access request and a transfer of data to a data terminal during the activation of the latency extension signal.

19. The memory access control method according to claim 18, further comprising:
deactivating the latency extension signal when the subsequent access request is not supplied for a certain period.

20. The memory access control method according to claim 18, wherein the latency includes at least one of a read latency in which read data is transferred to the data terminal based on a read request and a write latency in which write data is transferred to the data terminal based on a write request.

* * * * *